United States Patent
Cho et al.

(10) Patent No.: US 12,299,296 B2
(45) Date of Patent: May 13, 2025

(54) SEMICONDUCTOR MEMORY DEVICE AND METHOD OF ADJUSTING OPERATION CONDITION OF THE SAME

(71) Applicant: Samsung Electronics Co., Ltd., Suwon-si (KR)

(72) Inventors: Seunghyun Cho, Jinju-si (KR); Youngju Kim, Seoul (KR); Younghwa Kim, Hwaseong-si (KR); Yujung Song, Suwon-si (KR); Reum Oh, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 220 days.

(21) Appl. No.: 18/045,590

(22) Filed: Oct. 11, 2022

(65) Prior Publication Data
US 2023/0289072 A1  Sep. 14, 2023

(30) Foreign Application Priority Data
Mar. 10, 2022 (KR) .................. 10-2022-0030014
Apr. 11, 2022 (KR) .................. 10-2022-0044316

(51) Int. Cl.
| G11C 11/401 | (2006.01) |
| G06F 3/06 | (2006.01) |
| G11C 11/406 | (2006.01) |
| G11C 11/408 | (2006.01) |
| G11C 11/4097 | (2006.01) |

(52) U.S. Cl.
CPC .......... *G06F 3/0625* (2013.01); *G06F 3/0629* (2013.01); *G06F 3/064* (2013.01); *G06F 3/0673* (2013.01); *G11C 11/40611* (2013.01); *G11C 11/4087* (2013.01); *G11C 11/4097* (2013.01)

(58) Field of Classification Search
CPC .. G06F 3/0625; G06F 3/064; G11C 11/40611; G11C 11/4087; G11C 11/4097; G11C 11/4074
See application file for complete search history.

(56) References Cited

U.S. PATENT DOCUMENTS

| 5,638,534 A | 6/1997 | Mote |
| 6,249,476 B1 * | 6/2001 | Yamazaki .......... G11C 11/4097 365/230.06 |
| 6,385,101 B1 | 5/2002 | Chang et al. |
| 6,982,911 B2 | 1/2006 | Oh |

(Continued)

*Primary Examiner* — Mushfique Siddique
(74) *Attorney, Agent, or Firm* — Myers Bigel, P.A.

(57) ABSTRACT

A semiconductor memory device includes a memory cell array, a row decoder and a timing/voltage control circuit. The memory cell array is divided into a plurality of row blocks by one or more row block identity bits, and each of the of row blocks includes sub-array blocks arranged in a first direction. A row address includes the one or more row block identity bits. The row decoder activates a first word-line coupled to a first memory cell, activates a second word-line coupled to a second memory cell in response to the row address, and outputs a row block information signal. The timing/voltage control circuit adjusts at least one of an operation interval and an operation voltage of a memory operation on the first memory cell and the second memory cell according to a distance in a second direction crossing the first direction from a reference position, based on the row block information signal.

18 Claims, 26 Drawing Sheets

(56) References Cited

U.S. PATENT DOCUMENTS

| | | | |
|---|---|---|---|
| 7,126,852 B2* | 10/2006 | Hirabayashi | G11C 5/063 |
| | | | 365/189.04 |
| 8,988,917 B2 | 3/2015 | Kim et al. | |
| 9,418,750 B2 | 8/2016 | Wang et al. | |
| 9,576,621 B2 | 2/2017 | Seshadri et al. | |
| 2007/0002647 A1* | 1/2007 | Mori | G11C 29/808 |
| | | | 365/200 |
| 2018/0158494 A1* | 6/2018 | Park | G11C 29/00 |
| 2019/0348140 A1* | 11/2019 | Cho | G11C 29/806 |
| 2021/0012849 A1* | 1/2021 | Kim | G11C 29/4401 |

\* cited by examiner

FIG. 28

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| ACT | L | L | L | R0 | R1 | R2 | R3 | BA0 | BA1 | BG0 | BG1 | BG2 | CID0 | CID1 | CID2 |
|  | H | R4 | R5 | R6 | R7 | R8 | R9 | R10 | R11 | R12 | R13 | R14 | R15 | R16 | CID3/R17 |
| WR | L | L | L | H | H | L | BL | BA0 | BA1 | BG0 | BG1 | BG2 | CID0 | CID1 | CID2 |
|  | H | H | C3 | C4 | C5 | C6 | C7 | C8 | C9 | C10 | V | H | L | V | V |
| RD | L | L | L | H | H | H | BL | BA0 | BA1 | BG0 | BG1 | BG2 | CID0 | CID1 | CID2 |
|  | H | C2 | C3 | C4 | C5 | C6 | C7 | C8 | C9 | C10 | V | H | V | V | CID3 |

SEMICONDUCTOR MEMORY DEVICE AND METHOD OF ADJUSTING OPERATION CONDITION OF THE SAME

CROSS-REFERENCE TO RELATED APPLICATIONS

This application claims the benefit of priority under 35 USC § 119 to Korean Patent Application No. 10-2022-0030014, filed on Mar. 10, 2022 and to Korean Patent Application No. 10-2022-0044316, filed on Apr. 11, 2022, in the Korean Intellectual Property Office, the disclosure of each of which is incorporated by reference herein in its entirety.

BACKGROUND

The present disclosure relates to memories, and more particularly to semiconductor memory devices to control core operations and a method of operating the same.

Semiconductor memory devices may be classified as volatile memory devices or nonvolatile memory devices. A volatile memory device refers to a memory device that loses data stored therein at power-off. As an example of a volatile memory device, a dynamic random access memory (DRAM) may be used in various devices, such as a mobile system, a server, or a graphic device.

As a size of a memory cell array of a volatile memory device, such as dynamic random access memory (DRAM) device increases, RC loading of a column selection line and a global input/output (I/O) line pair increases according to a position of a memory cell and a difference between the characteristics of the global input/output (I/O) line pairs may occur.

SUMMARY

Example embodiments may provide a semiconductor memory device capable of controlling core operation timing differently according to a physical position of a target memory cell in a memory cell array.

Example embodiments may provide a method of a semiconductor memory device, capable of controlling core operation timing differently according to a physical position of a target memory cell in a memory cell array.

According to example embodiments, a semiconductor memory device includes a memory cell array, a row decoder, a column decoder and a timing/voltage control circuit. The memory cell array includes a plurality of bank arrays, each of the plurality of bank arrays includes a plurality of volatile memory cells coupled to word-lines and bit-lines, each of the plurality of bank arrays is divided into a plurality of row blocks by one or more row block identity bits, and each of the of row blocks includes a plurality of sub-array blocks arranged in a first direction, a row address comprising the one or more row block identity bits. The row decoder activates a first word-line coupled to a first memory cell from among the plurality of volatile memory cells, activates a second word-line coupled to a second memory cell from among the plurality of volatile memory cells in response to the row address and outputs a row block information signal indicating a first row block including the first memory cell and a second row block including the second memory cell. The column decoder accesses the first memory cell and the second memory cell through a first bit-line based on a column address. The timing/voltage control circuit receives the row block information signal and controls the column decoder to adjust at least one of an operation interval and an operation voltage of a memory operation on the first memory cell and the second memory cell according to a distance to the first row block and the second row block from the column decoder in a second direction crossing the first direction, based on the row block information signal.

According to example embodiments, there is provided a method of operating a semiconductor memory device. The semiconductor memory device includes a memory cell array including a plurality of bank arrays, each of the plurality of bank arrays includes a plurality of volatile memory cells coupled to word-lines and bit-lines, each of the plurality of bank arrays blocks are divided into a plurality of row blocks by one or more row block identity bits, and each of the of row blocks includes a plurality of sub-array blocks arranged in a first direction, a row address comprising the one or more row block identity bits. According to the method, an active command and an access address are received from an external memory controller, a row block information signal indicating a target row block including a target memory cell is generated by a row decoder coupled to the memory cell array through the word-lines, based on the access address, and at least one of an operation interval and an operation voltage of a memory operation on the target memory cell is adjusted using a timing/voltage control circuit, based on the row block information signal indicating a distance to the target row block from a column decoder in a second direction crossing the first direction.

According to example embodiments, a semiconductor memory device includes a semiconductor memory device includes a memory cell array, a row decoder, a column decoder and a timing/voltage control circuit. The memory cell array includes a plurality of bank arrays, each of the plurality of bank arrays includes a plurality of volatile memory cells coupled to word-lines and bit-lines, each of the plurality of bank arrays is divided into a plurality of row blocks by one or more row block identity bits, and each of the of row blocks includes a plurality of sub-array blocks arranged in a first direction, a row address comprising the one or more row block identity bits. The row decoder activates a first word-line coupled to a first memory cell from among the plurality of volatile memory cells, activates a second word-line coupled to a second memory cell from among the plurality of volatile memory cells in response to the row address, and outputs a row block information signal indicating a first row block including the first memory cell and a second row block including the second memory cell. The column decoder accesses the first memory cell and the second memory cell through a first bit-line based on a column address. The timing/voltage control circuit receives the row block information signal and controls the column decoder to adjust at least one of an operation interval and an operation voltage of a memory operation on the first memory cell and the second memory cell according to a distance to the first row block and the second row block from the column decoder in a second direction crossing the first direction, based on the row block information signal. A distance of the first memory cell in the second direction from a reference position is relatively short and a distance of the second memory cell in the second direction from the reference position is relatively long. The timing/voltage control circuit controls a column selection line driver to drive a column selection line such that a voltage level of the column selection line associated with selecting the second memory cell is greater than a voltage level of the column selection line associated with selecting the first memory cell, controls a local sense enable signal such that a first activation interval of the local sense enable signal associated with accessing the first memory cell is shorter than a second activation interval of the local sense enable signal associated with accessing the second memory cell, and controls an input/output (I/O) sense enable signal such that a first activation interval of the I/O sense enable signal associated with accessing the first memory cell is shorter than a second activation interval of the I/O sense enable signal associated with accessing the second memory cell.

Accordingly, a semiconductor memory device according to example embodiments, may adjust at least one of an operation interval and an operation voltage of a memory operation on a target memory cell based on a row block information signal indicating a distance of a target memory block, including the target memory cell, from a column decoder in a second direction. As a result, current consumption may be reduced and similar read operation characteristics may be obtained for memory cells having different distances from a reference position.

BRIEF DESCRIPTION OF THE DRAWINGS

Example embodiments will be described below in more detail with reference to the accompanying drawings.

FIG. 28 illustrates an example command, which may be used in the memory system of FIG. 1.

DETAILED DESCRIPTION

Figure 1:
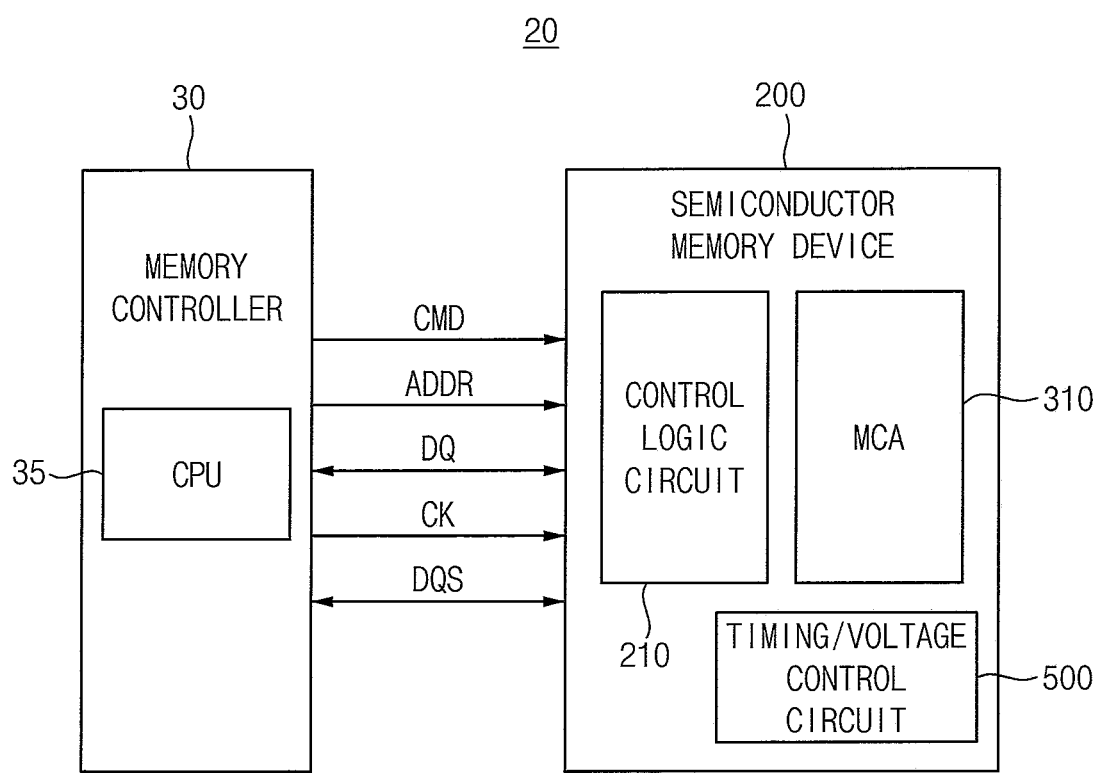
FIG. 1 is a block diagram illustrating a memory system according to example embodiments.

Various example embodiments will be described more fully hereinafter with reference to the accompanying drawings, in which example embodiments are shown. In the drawings, like numerals refer to like elements throughout this application and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram illustrating a memory system according to example embodiments.

Referring to FIG. 1, a memory system 20 may include a memory controller 30 and a semiconductor memory device 200.

The memory controller 30 may be configured to control overall operation of the memory system 20. The memory controller 30 may be configured to control overall data exchange between an external host and the semiconductor memory device 200. For example, the memory controller 30 may write data in the semiconductor memory device 200 or read data from the semiconductor memory device 200 in response to a request from the host.

In addition, the memory controller 30 may be configured to issue operation commands to the semiconductor memory device 200 for controlling the semiconductor memory device 200. In some example embodiments, the semiconductor memory device 200 is a memory device including dynamic memory cells, such as a dynamic random access memory (DRAM), double data rate 5 (DDR5) synchronous DRAM (SDRAM), a DDR6 SDRAM, or the like.

The memory controller 30 transmits a clock signal CK (the clock signal CK may be referred to a command clock signal), a command CMD, and an address (signal) ADDR to the semiconductor memory device 200. Herein, for convenience of description, the terms a clock signal CK, a command CMD, and an address ADDR and the terms clock signals CK, commands CMD, and addresses ADDR may be used interchangeably. The memory controller 30 may transmit a data strobe signal DQS to the semiconductor memory device 200 when the memory controller 30 writes data signal DQ in the semiconductor memory device 200. The semiconductor memory device 200 may transmit a data strobe signal DQS to the memory controller 30 when the memory controller 30 reads data signal DQ from the semiconductor memory device 200. The address ADDR may be accompanied by the command CMD and the address ADDR may be referred to as an access address.

The memory controller 30 may include a central processing unit (CPU) 35 that is configured to control overall operation of the memory controller 30.

The semiconductor memory device 200 may include a memory cell array MCA 310 that stores the data signal DQ, a control logic circuit 210 and a timing/voltage control circuit 500.

The control logic circuit 210 may be configured to control operations of the semiconductor memory device 200. The memory cell array 310 may include a plurality of bank arrays, and each of the plurality of bank arrays may include a plurality of volatile memory cells coupled to word-lines and bit-lines. Each of the plurality of bank arrays may be divided into a plurality of row blocks by a row block identity bit corresponding to a portion of bits of a row address, and each of the of row blocks may include a plurality of sub-array blocks arranged in a first direction.

The timing/voltage control circuit 500 may receive a row block information signal indicating a first row block including a first memory cell from among the plurality of volatile memory cells and a second row block including a second memory cell from among the plurality of volatile memory cells and may control a column decoder to adjust at least one of an operation interval and an operation voltage of a memory operation on the first memory cell and the second memory cell according to a distance to the first row block and the second row block from the column decoder in a second direction crossing the first direction, based on the row block information signal.

The semiconductor memory device 200 performs a refresh operation periodically due to charge leakage of memory cells storing data. Due to scale down of the manufacturing process of the semiconductor memory device 200, the storage capacitance of the memory cell may be decreased and the refresh period may be shortened. The refresh period is further shortened because the entire refresh time is increased as the memory capacity of the semiconductor memory device 200 is increased.

To compensate for degradation of adjacent memory cells due to the intensive access to a particular row or a hammer address, a target row refresh (TRR) scheme has been adopted and an in-memory refresh scheme has been developed to reduce the burden of the memory controller. The memory controller is totally responsible for the hammer refresh operation in the TRR scheme and the semiconductor memory device is totally responsible for the hammer refresh operation in the in-memory refresh scheme.

The chip size overhead for the in-memory refresh may be an issue for consideration as the memory capacity may be increased and demands on low power consumption of the semiconductor memory device may be increased. In addition, the power consumption may be increased because the semiconductor memory device has to carry out the hammer refresh operation even though there is no intensive access.

Figure 2:
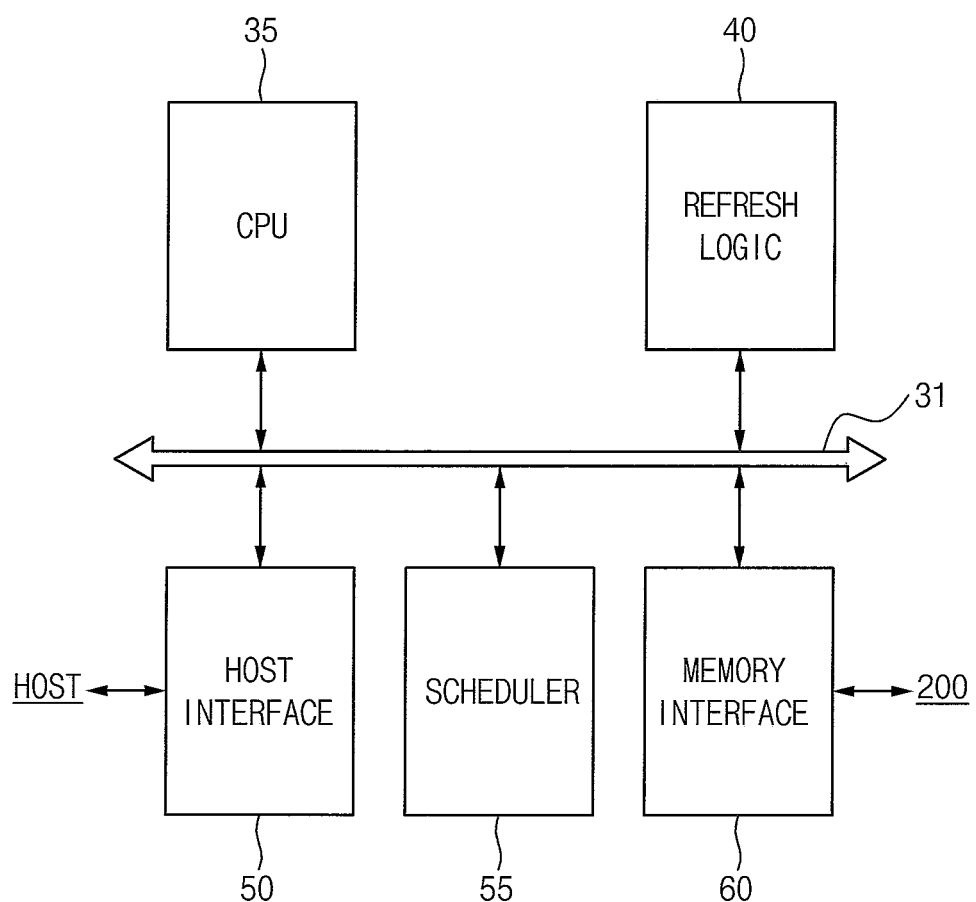
FIG. 2 is a block diagram illustrating the memory controller of FIG. 1 according to example embodiments.

FIG. 2 is a block diagram illustrating the memory controller of FIG. 1 according to example embodiments.

Referring to FIG. 2, the memory controller 30 may include the CPU 35, a refresh logic 40, a host interface 50, a scheduler 55 and a memory interface 60, which are connected to each other through a bus 31.

The CPU 35 may be configured to control overall operation of the memory controller 30. The CPU 35 may be configured to control the refresh logic 40, the host interface 50, the scheduler 55 and the memory interface 60 through the bus 31.

The refresh logic 40 may be configured to generate auto refresh command for refreshing memory cells of the plurality of memory cell rows based on a refresh interval of the semiconductor memory device 200.

The host interface 50 may be configured to perform interfacing with a host. The memory interface 60 may be configured to perform interfacing with the semiconductor memory device 200.

The scheduler 55 may be configured to manage scheduling and transmission of sequences of commands generated in the memory controller 30. The scheduler 55 may be configured to transmit the active command and a subsequent command to the semiconductor memory device 200 via the memory interface 60 and the semiconductor memory device 200 may be configured to perform a memory operation on the target memory cell in response to the subsequent command.

Figure 3:
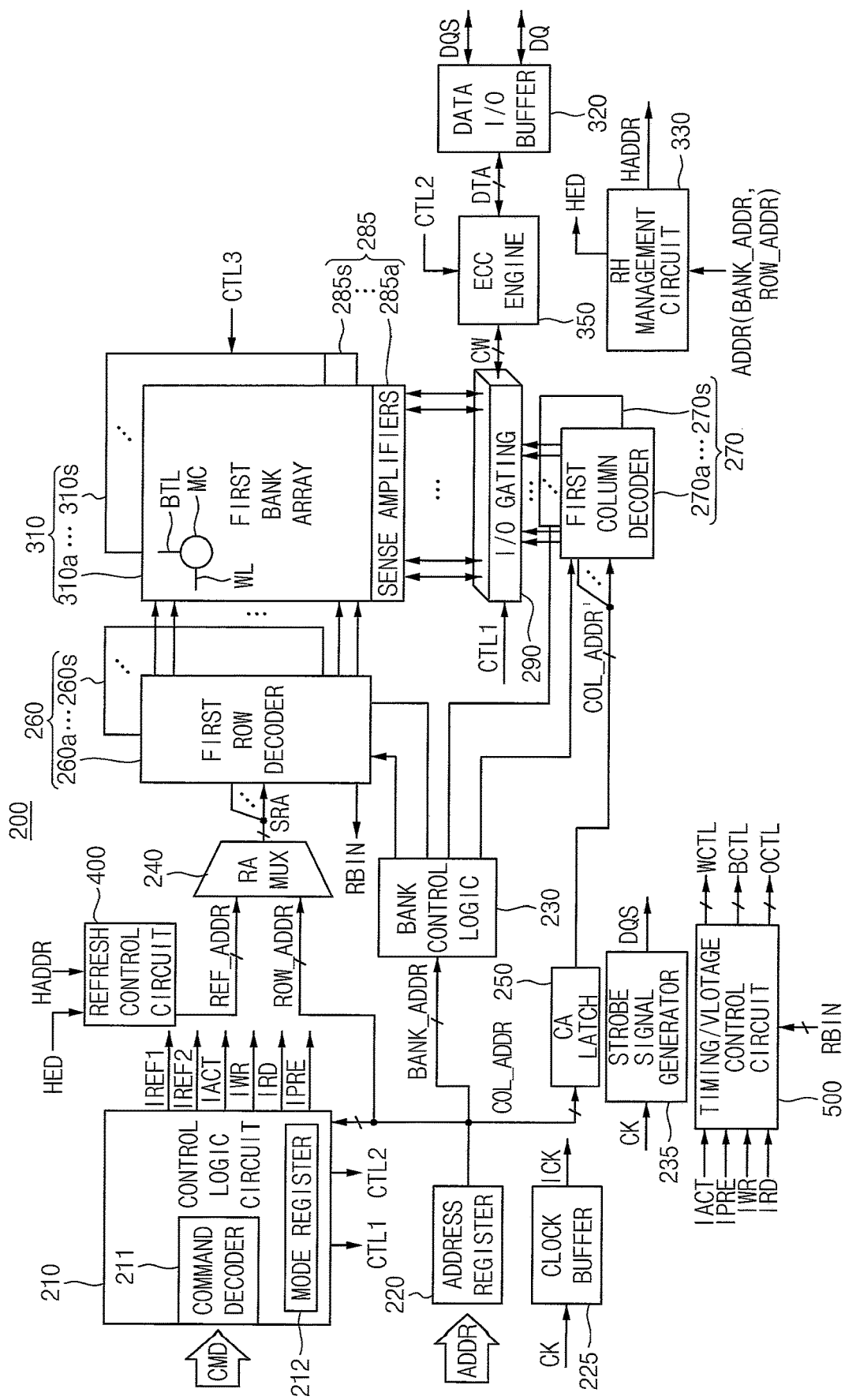
FIG. 3 is a block diagram illustrating an example of the semiconductor memory device of FIG. 1 according to example embodiments.

FIG. 3 is a block diagram illustrating an example of the semiconductor memory device of FIG. 1 according to example embodiments.

Referring to FIG. 3, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an input/output (I/O) gating circuit 290, an error correction code (ECC) engine 350, a clock buffer 225, a strobe signal generator 235, a row hammer (RH) management circuit 330, the timing/voltage control circuit 500, and a data I/O buffer 320.

The memory cell array 310 may include first through sixteenth bank arrays 310a-310s. The row decoder 260 may include first through sixteenth row decoders 260a-260s respectively coupled to the first through sixteenth bank arrays 310a-310s, the column decoder 270 may include first through sixteenth column decoders 270a-270s respectively coupled to the first through sixteenth bank arrays 310a-310s, and the sense amplifier unit 285 may include first through sixteenth sense amplifiers 285a-285s respectively coupled to the first through sixteenth bank arrays 310a-310s.

The first through sixteenth bank arrays 310a-310s, the first through sixteenth row decoders 260a-260s, the first through sixteenth column decoders 270a-270s and first through sixteenth sense amplifiers 285a-285s may form first through sixteenth banks. Each of the first through sixteenth bank arrays 310a-310s includes a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250 and the row hammer management circuit 330.

The bank control logic 230 may be configured to generate bank control signals in response to the bank address BANK_ADDR. One of the first through sixteenth row decoders 260a~260s corresponding to the bank address BANK_ADDR is activated in response to the bank control signals, and one of the first through sixteenth column decoders 270a~270s corresponding to the bank address BANK_ADDR is activated in response to the bank control signals.

The row address multiplexer 240 may receive the row address ROW_ADDR from the address register 220, and may receive a refresh row address REF_ADDR from the refresh control circuit 400. The row address multiplexer 240 may be configured to selectively output the row address ROW_ADDR or the refresh row address REF_ADDR as a row address SRA. The row address SRA that is output from the row address multiplexer 240 is applied to the first through sixteenth row decoders 260a~260s.

The refresh control circuit 400 may sequentially increase or decrease the refresh row address REF_ADDR in a normal refresh mode in response to first and second refresh control signals IREF1 and IREF2 from the control logic circuit 210. The refresh control circuit 400 may receive a hammer address HADDR in a hammer refresh mode, and may be configured to output one or more hammer refresh row addresses designating one or more victim memory cell rows physically adjacent to a memory cell row corresponding to the hammer address as the refresh row address REF_ADDR.

The activated one of the first through sixteenth row decoders 260a~260s, by the bank control logic 230, may be configured to decode the row address SRA that is output from the row address multiplexer 240, and may be configured to activate a word-line corresponding to the row address SRA. For example, the activated bank row decoder applies a word-line driving voltage to the word-line corresponding to the row address.

The column address latch 250 may receive the column address COL_ADDR from the address register 220, and may temporarily store the received column address COL_ADDR. In some embodiments, in a burst mode, the column address latch 250 may generate column address COL_ADDR' that increment from the received column address COL_ADDR. The column address latch 250 may apply the temporarily stored or generated column address COL_ADDR' to the first through sixteenth column decoders 270a~270s.

The activated one of the first through sixteenth column decoders 270a~270s may be configured to activate a sense amplifier corresponding to the bank address BANK_ADDR and the column address COL_ADDR through the I/O gating circuit 290.

The I/O gating circuit 290 may include circuitry for gating input/output data, and may further include input data mask logic, read data latches for storing a codeword that is output from the first through sixteenth bank arrays 310a-310s, and write drivers for writing data to the first through sixteenth bank arrays 310a~310s.

A codeword CW read from a selected one bank array of the first through sixteenth bank arrays 310a~310s is sensed by a sense amplifier coupled to the selected one bank array from which the data is to be read, and is stored in the read data latches. The codeword CW stored in the read data latches may be provided to the data I/O buffer 320 as data DTA after ECC decoding is performed on the codeword CW by the ECC engine 350. The data I/O buffer 320 may be configured to convert the data DTA into the data signal DQ and may be configured to transmit the data signal DQ along with the data strobe signal DQS to the memory controller 30.

The data signal DQ to be written in a selected one bank array of the first through sixteenth bank arrays 310a~310s may be provided to the data I/O buffer 320 from the memory controller 30. The data I/O buffer 320 may be configured to convert the data signal DQ to the data DTA and may be configured to provide the data DTA to the ECC engine 350. The ECC engine 350 may perform an ECC encoding on the data DTA to generate parity bits, and the ECC engine 350 may provide the codeword CW including data DTA and the parity bits to the I/O gating circuit 290. The I/O gating circuit 290 may be configured to write the codeword CW in a sub-page in the selected one bank array through the write drivers.

The data I/O buffer 320 may provide the data signal DQ from the memory controller 30 to the ECC engine 350 by converting the data signal DQ to the data DTA in a write operation of the semiconductor memory device 200 and may be configured to convert the data DTA to the data signal DQ from the ECC engine 350. The data I/O buffer 320 may be further configured to transmit the data signal DQ and the data strobe signal DQS to the memory controller 30 in a read operation of the semiconductor memory device 200.

The ECC engine 350 may be configured to perform an ECC encoding on the data DTA and may be configured to perform an ECC decoding on the codeword CW based on a second control signal CTL2 from the control logic circuit 210. The ECC engine 350 may be configured to perform an ECC encoding and an ECC decoding on count data CNTD provided from the row hammer management circuit 500 based on the second control signal CTL2 from the control logic circuit 210.

The clock buffer 225 may receive the clock signal CK, may be configured to generate an internal clock signal ICK by buffering the clock signal CK, and may be configured to provide the internal clock signal ICK to circuit components processing the command CMD and the address ADDR.

The strobe signal generator 235 may receive the clock signal CK, may generate the data strobe signal DQS based on the clock signal CK and may be configured to provide the data strobe signal DQS to the memory controller 30.

The control logic circuit 210 may be configured to control operations of the semiconductor memory device 200. For example, the control logic circuit 210 may be configured to generate control signals for the semiconductor memory device 200 to perform a write operation, a read operation, a normal refresh operation, and/or a hammer refresh operation. The control logic circuit 210 includes a command decoder 211 that is configured to decode the command CMD received from the memory controller 30 and a mode register 212 that is configured to set an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may be configured to provide a first control signal CTL1 to the I/O gating circuit 290 and may be configured to provide the second control signal CTL2 to the ECC engine 350. In addition, the command decoder 211 may generate internal command signals including the first refresh control signal IREF1, the second refresh control signal IREF2, an active signal TACT, a precharge signal IPRE, a read signal IRD, and a write signal IWR by decoding the command CMD.

The timing/voltage control circuit 500 may receive the active signal TACT, the precharge signal IPRE, the read signal IRD, the write signal IWR and a row block information signal RBIN and may be configured to generate a word-line control signal WCTL for controlling word-lines, a bit-line control signal BCTL for controlling bit-lines and an operation control signal OCTL for controlling an operation interval and an operation voltage of a memory operation on the target memory cell. The timing/voltage control circuit 500 may be configured to provide the word-line control signal WCTL and the bit-line control signal BCTL to the memory cell array 310 and may be configured to provide the operation control signal OCTL to the column decoder 290 and the sense amplifier unit 285.

Figure 4:
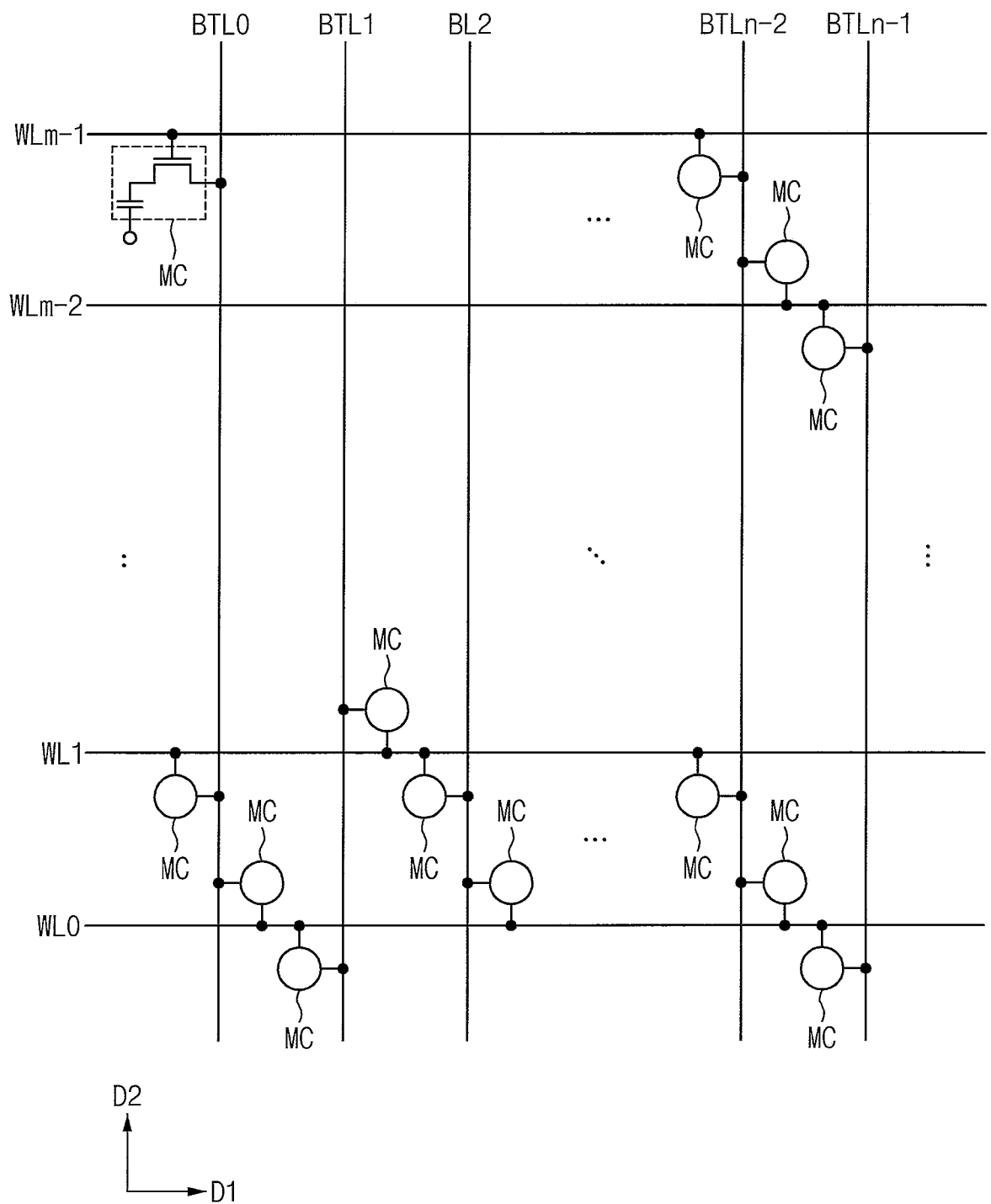
FIG. 4 illustrates an example of the first bank array of the semiconductor memory device of FIG. 3.

FIG. 4 illustrates an example of the first bank array of the semiconductor memory device of FIG. 3.

Referring to FIG. 4, the first bank array 310a may include a plurality of word-lines WL0~WLm−1 (m is a natural number greater than two), a plurality of bit-lines BTL0~BTLn−1 (n is a natural number greater than two), and a plurality of memory cells MCs disposed at intersections between the word-lines WL0~WLm−1 and the bit-lines BTL0~BTLn−1. Each of the memory cells MCs may include a cell transistor coupled to each of the word-lines WL0~WLm−1 and each of the bit-lines BTL0~BTLn−1 and a cell capacitor coupled to the cell transistor. Each of the memory cells MCs may have a DRAM cell structure. Each of the word-lines WL0~WLm−1 extends in a first direction D1 and each of the bit-lines BTL0~BTLn−1 extends in a second direction D2 crossing the first direction D1.

The word-lines WL0~WLm−1 coupled to the plurality of memory cells MCs may be referred to as rows of the first bank array 310a and the bit-lines BTL0~BTLn−1 coupled to the plurality of memory cells MCs may be referred to as columns of the first bank array 310a.

Figure 5:
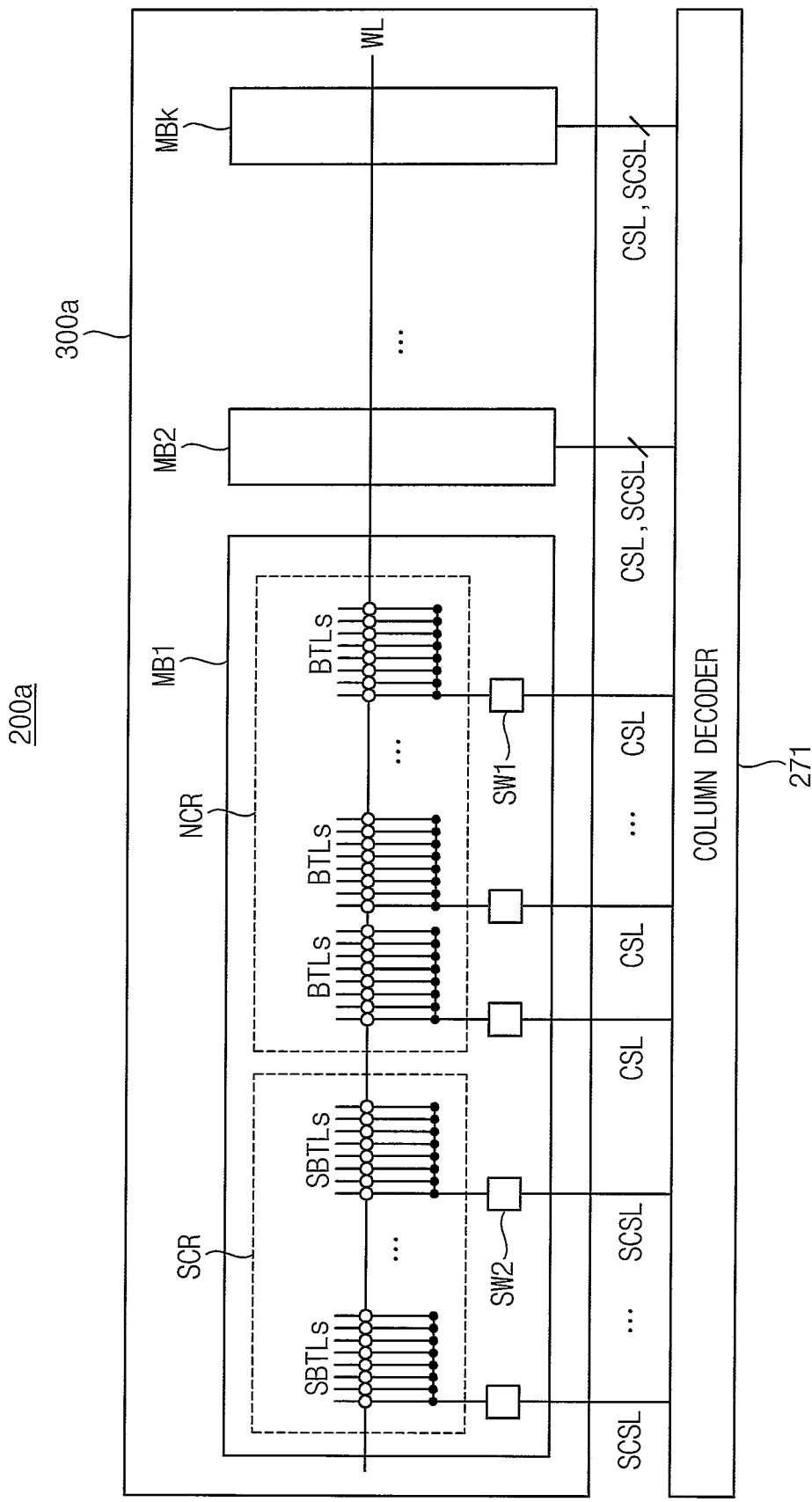
FIG. 5 is a block diagram illustrating an example of a semiconductor memory device according to example embodiments.

FIG. 5 is a block diagram illustrating an example of a semiconductor memory device according to example embodiments.

Referring to FIG. 5, a semiconductor memory device 200a may include a memory cell array 300a and a column decoder 271.

The memory cell array 300a may include a plurality of memory blocks MB1~MBk (where, k is an integer greater than one), and each of the memory blocks MB1~MBk includes memory cells coupled to word-lines WLs and bit-lines BTLs and spare cells coupled to the word-lines WLs and at least one spare bit-line SBTL. The memory blocks MB1~MBk share the word-line WLs and do not share the bit-lines BTLs and the spare bit-line SBTL. Data associated with each of the memory blocks MB1~MBk may be input/output through corresponding input/output pad.

In FIG. 5, only the first memory block MB1 is shown in detail for brevity of illustration. Each of the memory blocks MB2~MBk may be configured and/or implemented in the same or similar manner as the first memory block MB1.

The column decoder 271 may select a column selection line CSL of each of the memory blocks MB1~MBk based on a write command or a read command. Each of the column selection lines CSL may be connected to a plurality of bit-lines BLs through a switch SW1. The column decoder 271 may selectively select a spare column selection lines SCSL of each of the memory blocks MB1~MBk based on the write command or the read command instead of the column selection line CSL. The spare column selection lines SCSL may be connected to spare bit-lines SBLs through a switch SW2.

The first memory block MB1 includes a normal cell region NCR and a spare cell region SCR.

Figure 6:
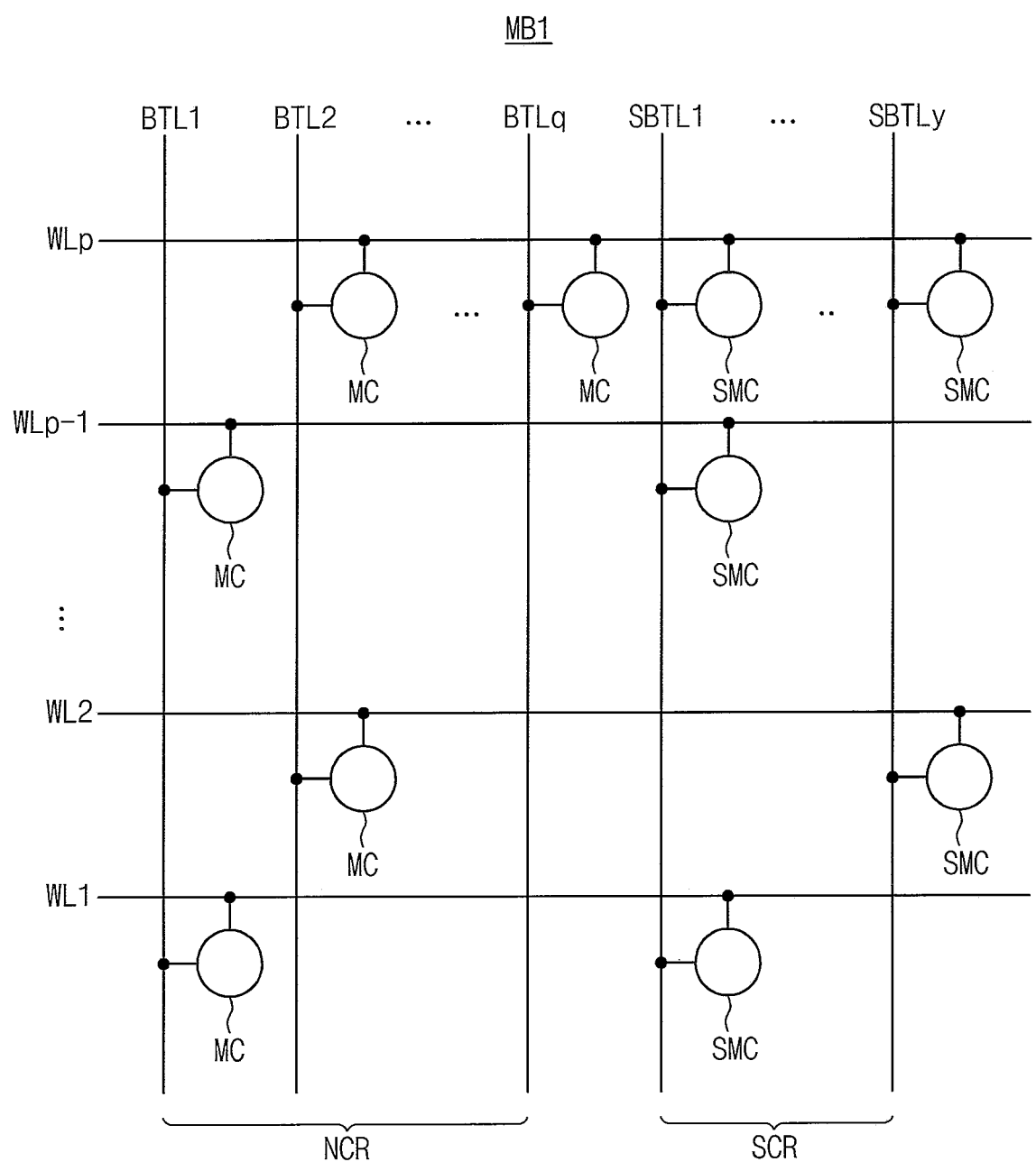
FIG. 6 illustrates an example of the first memory block of the semiconductor memory device of FIG. 5.

FIG. 6 illustrates an example of the first memory block of the semiconductor memory device of FIG. 5.

Referring to FIG. 6, the first memory block MB1 may include a normal cell region NCR and a spare cell region SCR. The normal cell region NCR may include a plurality of word-lines WL1~WLp (p is a natural number greater than two) extending in a first direction D1, a plurality of bit-lines BTL1~BTLq (q is a natural number greater than two) extending in a second direction D2 crossing the first direction D1, and a plurality of memory cells MCs disposed at intersections between the word-lines WL1~WLp and the bit-lines BTL1~BTLq. The spare cell region SCR may include a plurality of spare bit-lines SBTL1~SBTLy (y is a natural number greater than two), the word-lines WL1~WLm, and a plurality of spare cells SMCs disposed at intersections between the word-lines WL1~WLm and the spare bit-lines SBTL1~SBTLy. When at least one of the memory cells MCs has a defect, a defective memory cell may be repaired using the spare cell SMC.

Figure 7:
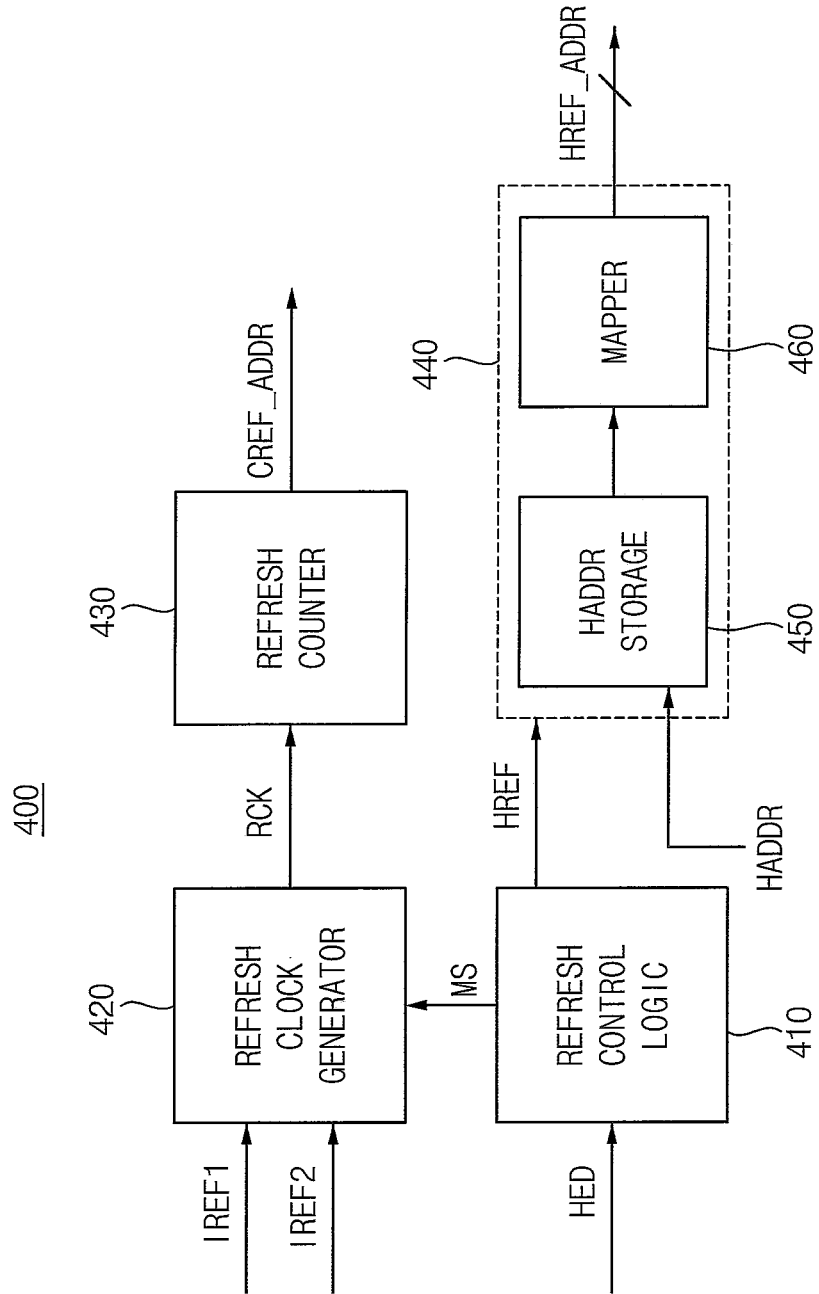
FIG. 7 is a block diagram illustrating an example of the refresh control circuit of FIG. 3 according to example embodiments.

FIG. 7 is a block diagram illustrating an example of the refresh control circuit of FIG. 3 according to example embodiments.

Referring to FIG. 7, the refresh control circuit 400 may include a refresh control logic 410, a refresh clock generator 420, a refresh counter 430, and a hammer refresh address generator 440.

The refresh control logic 410 may be configured to provide a mode signal MS in response to the hammer event detection signal HED. In addition, the refresh control logic 410 may be configured to provide the hammer refresh address generator 440 with a hammer refresh signal HREF to control output timing of the hammer address in response to one of the first refresh control signal IREF1 and the second refresh control signal IREF2.

The refresh clock generator 420 may be configured to generate a refresh clock signal RCK indicating a timing of a normal refresh operation based on the first refresh control signal IREF1, the second refresh control signal IREF2 and the mode signal MS. The refresh clock generator 420 may be configured to generate the refresh clock signal RCK in response to the receiving the first refresh control signal IREF1 or during activation interval of the second refresh control signal IREF2.

When the command CMD from the memory controller 30 corresponds to an auto refresh command, the control logic circuit 210 in FIG. 3 may be configured to apply the first refresh control signal IREF1 to the refresh control circuit 400 whenever the control logic circuit 210 receives the auto refresh command. When the command CMD from the memory controller 30 corresponds to a self-refresh entry command, the control logic circuit 210 may be configured to apply the second refresh control signal IREF2 to the refresh control circuit 400 and the second refresh control signal IREF2 is activated from a time point when the control logic circuit 210 receives the self-refresh entry command to a time point when control logic circuit 210 receives a self-refresh exit command.

The refresh counter 430 may be configured to generate a counter refresh address CREF_ADDR designating sequentially the memory cell rows by performing a counting operation at the period of the refresh clock signal RCK, and may be configured to provide the counter refresh address CREF_ADDR as the refresh row address REF_ADDR to the row address multiplexer 240 in FIG. 3.

The hammer refresh address generator 440 may include a hammer address (HADDR) storage 450 and a mapper 460.

The hammer address storage 450 may be configured to store the hammer address HADDR and may be configured to output the hammer address HADDR to the mapper 460 in response to the hammer refresh signal HREF. The mapper 460 may be configured to generate one or more hammer refresh addresses HREF_ADDR designating one or more victim memory cell rows physically adjacent to a memory cell row corresponding to the hammer address HADDR.

The hammer refresh address generator 440 may be configured to provide the hammer refresh address HREF_ADDR as the refresh row address REF_ADDR to the row address multiplexer 240 in FIG. 3.

Figure 8:
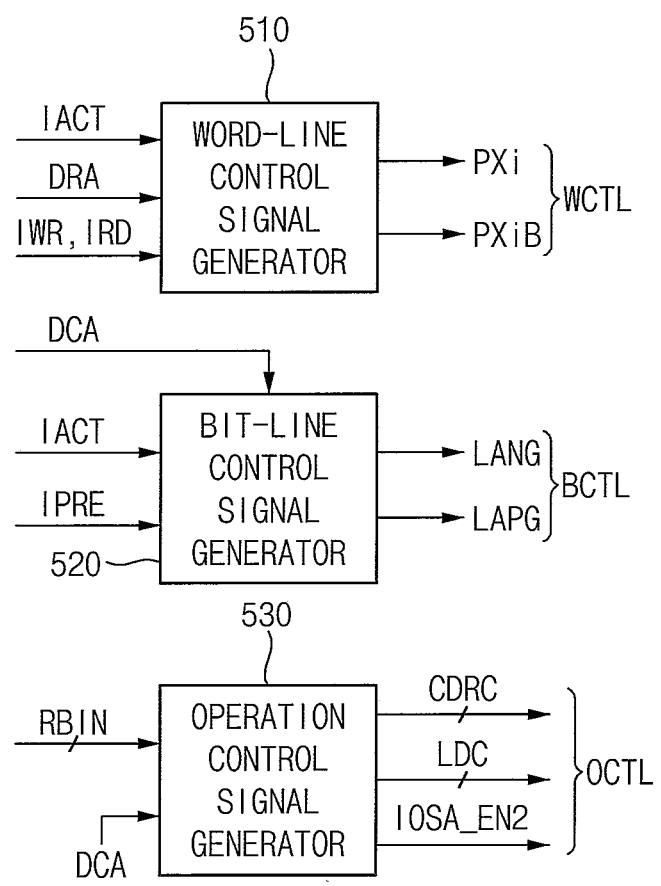
FIG. 8 is a block diagram illustrating an example of the timing/voltage control circuit of FIG. 3 according to example embodiments.

FIG. 8 is a block diagram illustrating an example of the timing/voltage control circuit of FIG. 3 according to example embodiments.

Referring to FIG. 8, the timing/voltage control circuit 500 may include a word-line control signal generator 510, a bit-line control signal generator 520, and an operation control signal generator 530.

The word-line control signal generator 510 may be configured to generate a word-line control signal WCTL including first and second word-line control signals PXi and PXiB to control a word-line based on the internal command signals IACT, IWR and IRD corresponding to the command CMD a decoded row address DRA. In addition, the word-line control signal generator 510 may be configured to provide the first and second word-line control signals PXi and PXiB to the memory cell array 310.

The bit-line control signal generator 520 may be configured to generate the bit-line control signal BCTL including second control signals LANG and LAPG to control voltage levels of a bit-line pair of a selected memory cell, in response to the internal command signals IACT and IPRE and a decoded column address DCA and may be configured to provide the second control signals LANG and LAPG to the memory cell array 310.

The operation control signal generator 530 may be configured to generate an operation control signal OCTL including a first driving control signal CRDC associated with a column selection line driver, a second driving control signal LDC associated with a local sense amplifier, and an I/O sense enable signal IOSA_EN2 associated with an I/O sense amplifier based on the decoded column address DCA and the row block information signal RBIN, may be configured to provide the first driving control signal CRDC and the second driving control signal LDC to the column decoder 270, and may be configured to provide the I/O sense enable signal IOSA_EN2 to the sense amplifier unit 285.

Figure 9:
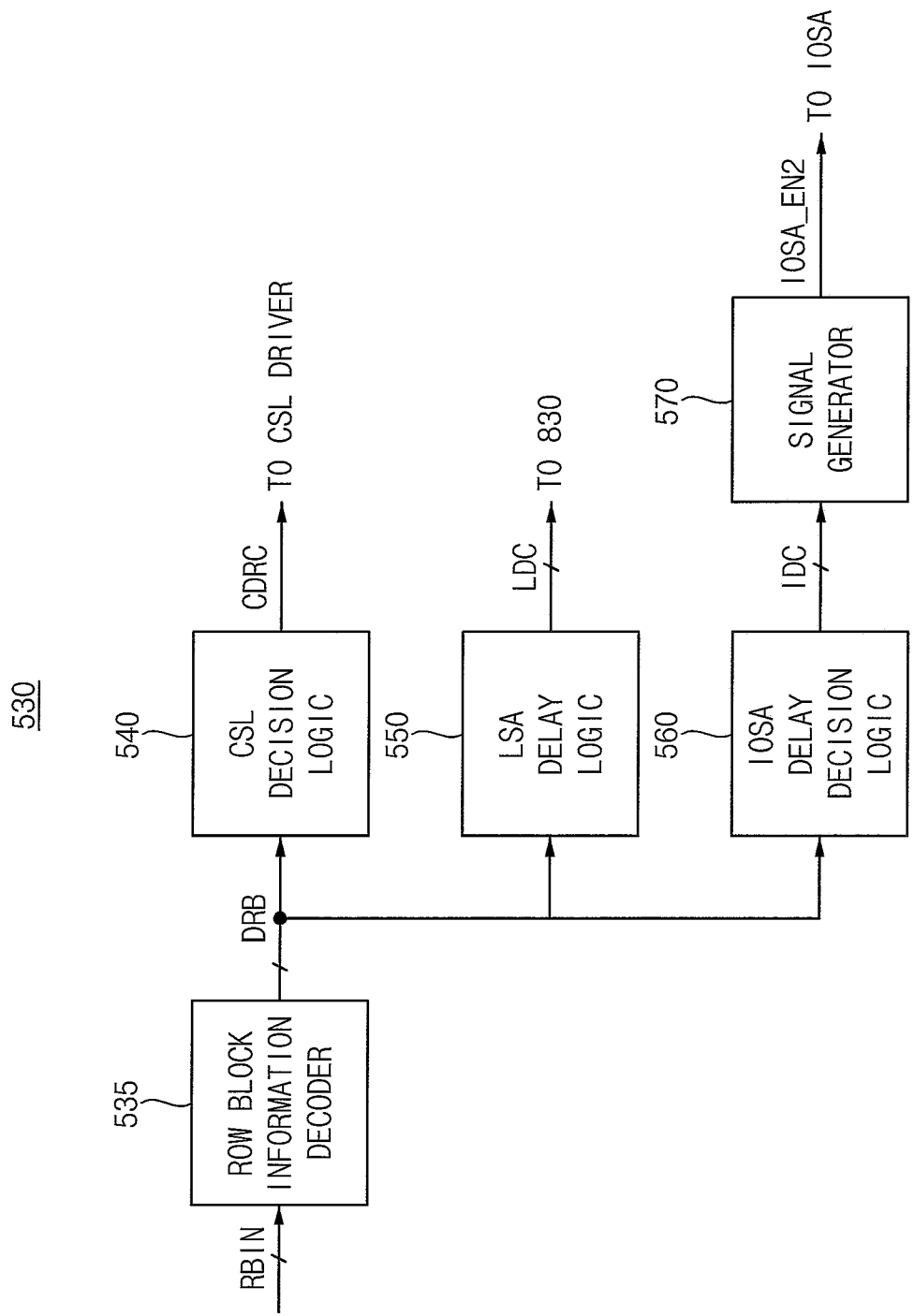
FIG. 9 is a block diagram illustrating an example of the operation control signal generator of the timing/voltage control circuit of FIG. 8 according to some example embodiments.

FIG. 9 is a block diagram illustrating an example of the operation control signal generator of the timing/voltage control circuit of FIG. 8 according to some example embodiments.

Referring to FIG. 9, the operation control signal generator 530 may include a row block information decoder 535, a column selection line (CSL) decision logic 540, a first (LSA DELAY) decision logic 550, a second (IOSA DELAY) decision logic 560, and a first signal generator 570.

The row block information decoder 535 may receive the row block information signal RBIN and may be configured to decode the row block information signal RBIN to output a decoded row block information signal DRB.

The CSL decision logic 540 may be configured to generate the first driving control signal for controlling a column selection line driver based on the decoded row block signal DRB.

Figure 16:
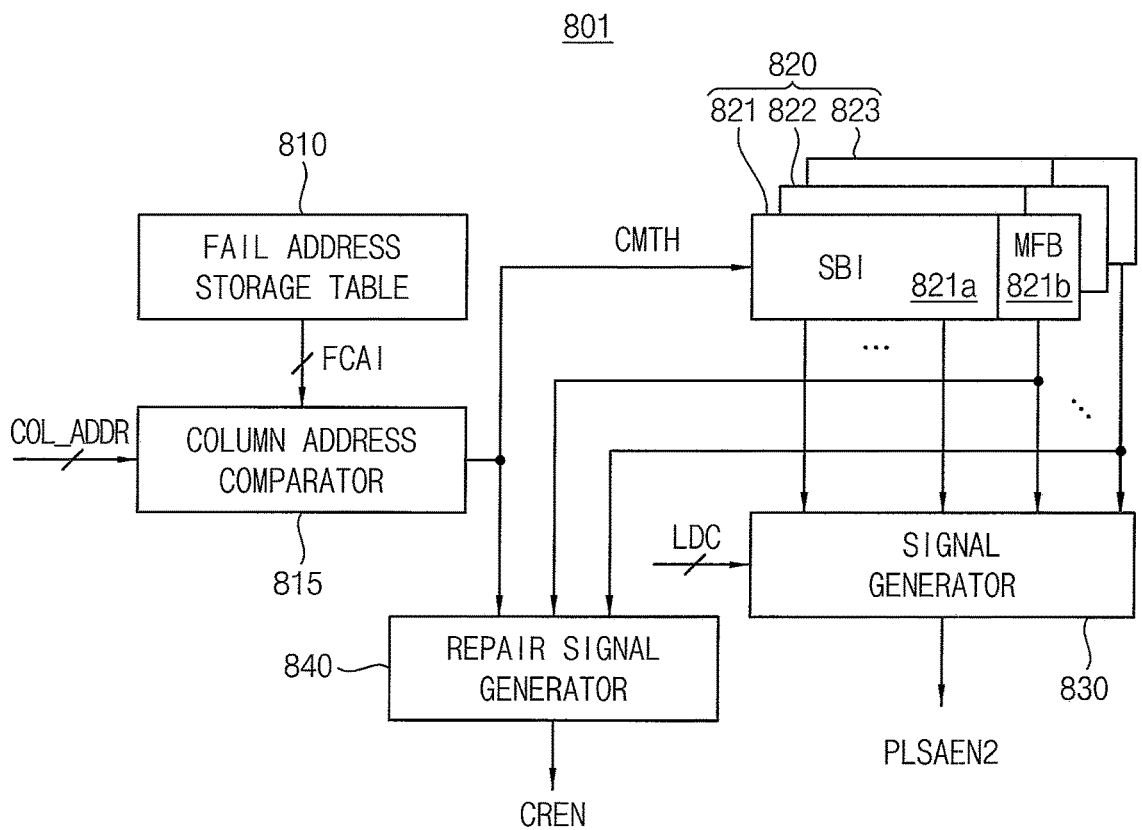
FIG. 16 is a block diagram illustrating a first repair circuit of the repair circuits of FIG. 10A according to example embodiments.

The first decision logic 550 may be configured to generate the second driving control signal LDC to determine an activation interval of the local sense enable signal that activates a local sense amplifier based on the decoded row block signal DRB and may be configured to provide the second driving control signal LDC to a second signal generator 830 in FIG. 16.

The second decision logic 560 may be configured to generate a third driving control signal IDC to determine an activation interval of an I/O sense enable signal that activates an I/O sense amplifier based on the decoded row block signal DRB and may be configured to provide the third driving control signal IDC to the first signal generator 570. The first signal generator 570 may be configured to generate an I/O sense enable signal IOSA_EN2 based on the third driving control signal IDC.

Figure 10A:
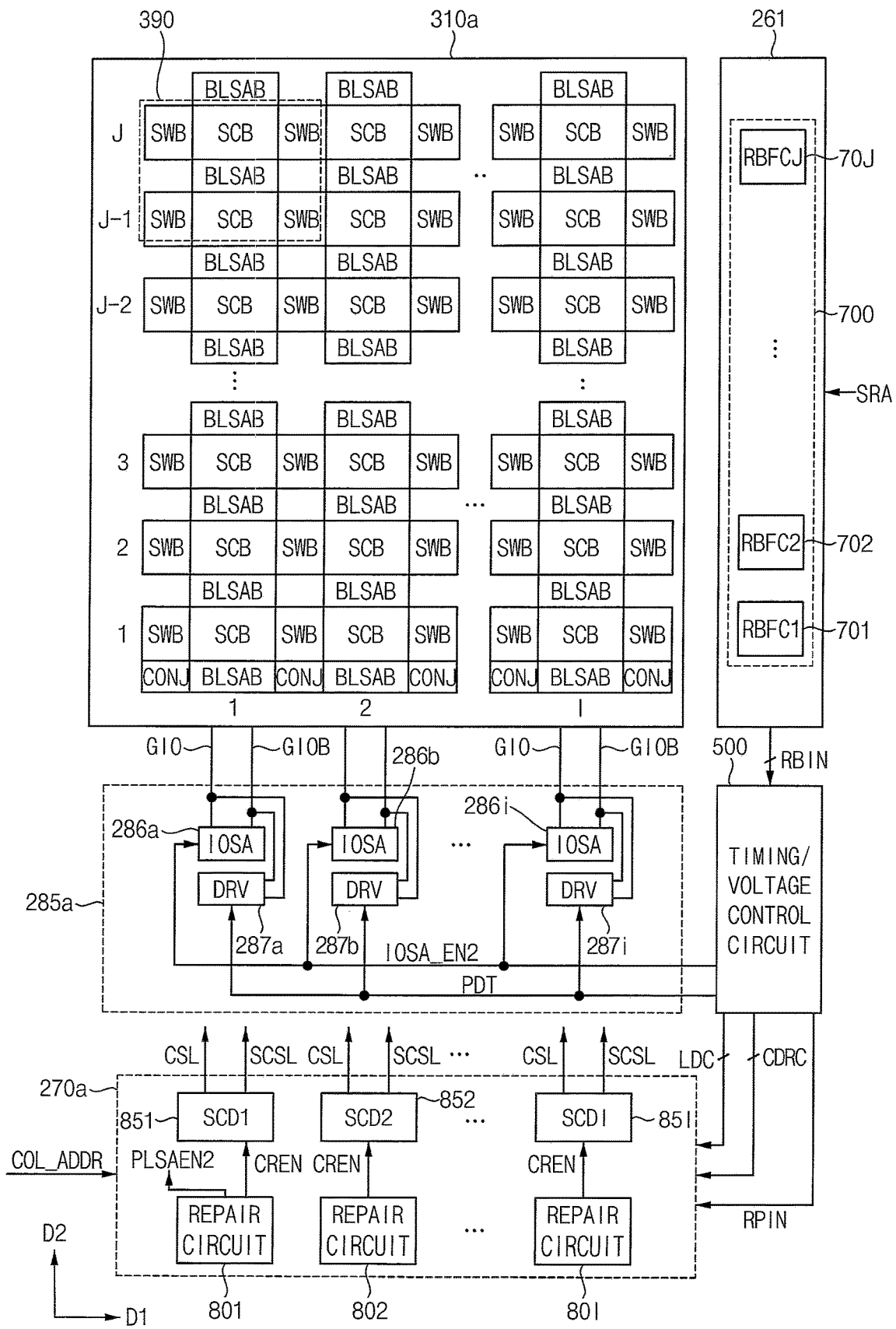
FIG. 10A illustrates an example of the first bank array, the first row decoder, the first sense amplifier, the first column decoder, and the timing/voltage control circuit of the semiconductor memory device of FIG. 3 according to some example embodiments.

FIG. 10A illustrates an example of the first bank array, the first row decoder, the first sense amplifier, the first column decoder, and the timing/voltage control circuit of the semiconductor memory device of FIG. 3 according to some example embodiments.

Referring to FIG. 10A, in the first bank array 310*a*, I sub-array blocks SCB may be disposed in the first direction D1, and J sub-array blocks SCB may be disposed in the second direction D2 perpendicular to the first direction D1. I and J represent a number of the sub-array blocks SCB in the first direction D1 and the second direction D2, respectively, and are natural numbers greater than two.

I sub-array blocks SCB disposed in the first direction D1 in one row may be referred to as a row block. A plurality of bit-lines, a plurality of word-lines, and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example, between the sub-array blocks SCB in the second direction D2 and above and below each of the sub-array blocks SCB in the second direction D2. Bit-line sense amplifiers configured to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator may be disposed in each of the conjunction regions CONJ.

The first sense amplifier 285a may be disposed in the first direction D1 with respect to the first bank array 310a and the first sense amplifier 285a may include I I/O sense amplifiers IOSAs 286a, 286b, . . . , 286i and I drivers DRVs 287a, 287b, 287i. Each of the I I/O sense amplifiers IOSAs 286a, 286b, . . . , 286i and each of the I drivers DRVs 287a, 287b, . . . , 287i may be connected to global I/O lines GIO and GIOB.

The timing/voltage control circuit 500 may be configured to control the I I/O sense amplifiers IOSAs 286a, 286b, . . . , 286i and the I drivers DRVs 287a, 287b, . . . , 287i. The timing/voltage control circuit 500 may be configured to provide the I/O sense enable signal IOSA_EN2 to the I/O sense amplifiers IOSAs 286a, 286b, . . . , 286i in a read operation and may be configured to provide a driving signal PDT to the I drivers DRVs 287a, 287b, . . . , 287i.

The first row decoder 260a may include a row block information circuit 700 and the row block information circuit 700 may include a plurality of row block fuse circuits 701-70J corresponding to the row blocks in the second direction D2. The row block fuse circuits 701-70J may be configured to output the row block information signal RBIN to the timing/voltage control circuit 500 in response to the row block identity bits of the row address SRA.

The timing/voltage control circuit 500, based on the row block information signal RBIN, may be configured to provide the first driving control signal CRDC and the second driving control signal LDC to the first column decoder 270a and may be configured to provide the first column decoder 270a with repair information RPIN associated with at least one defective memory cell in each of the sub array blocks SCB.

The first column decoder 270a may include a plurality of sub column decoders SCD1, SCD2, . . . , SCDI 851~85I and a plurality of repair circuits 801~80I. Each of the sub column decoders 851~85I may be connected to corresponding one of the memory blocks and the plurality of repair circuits 801~80I may correspond to the plurality of sub column decoders 851~85I. Each of the repair circuits 801~80I may be configured to selectively activate a repair signal CREN in response to the column address COL_ADDR and the repair information RPIN to provide the repair signal CREN to corresponding one of the sub column decoders 851~85I. Each of the sub column decoders 851~85I may be configured to select the column selection lines CSL or the spare column selection line SCSL in response to the repair signal CREN. When the repair signal CREN is deactivated, each of the sub column decoders 851~85I may be configured to select the column selection lines CSL. When the repair signal CREN is activated, each of the sub column decoders 851~85I may be configured to select the spare column selection lines SCSL. Each of the sub repair circuits 801~80I may be configured to provide a local sense enable signal PLSAEN2 to a corresponding sub array block SCB.

A portion 390 in the first bank array 310a will be described with reference to FIG. 11 below.

Figure 10B:
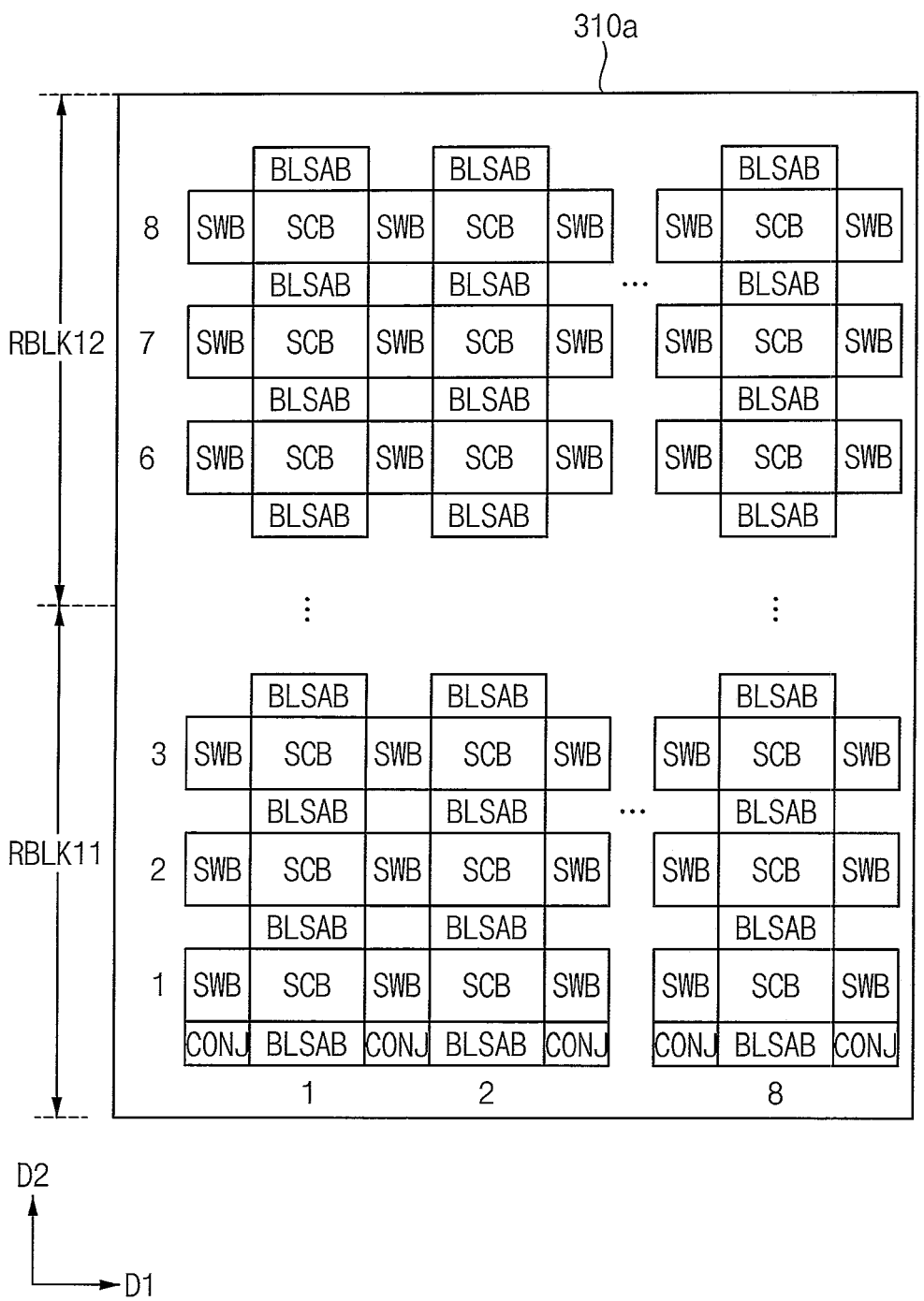
FIGS. 10B and 10C illustrate that the sub array blocks of the first bank array are divided into row blocks by one or more row block identity bits, respectively.
Figure 10C:
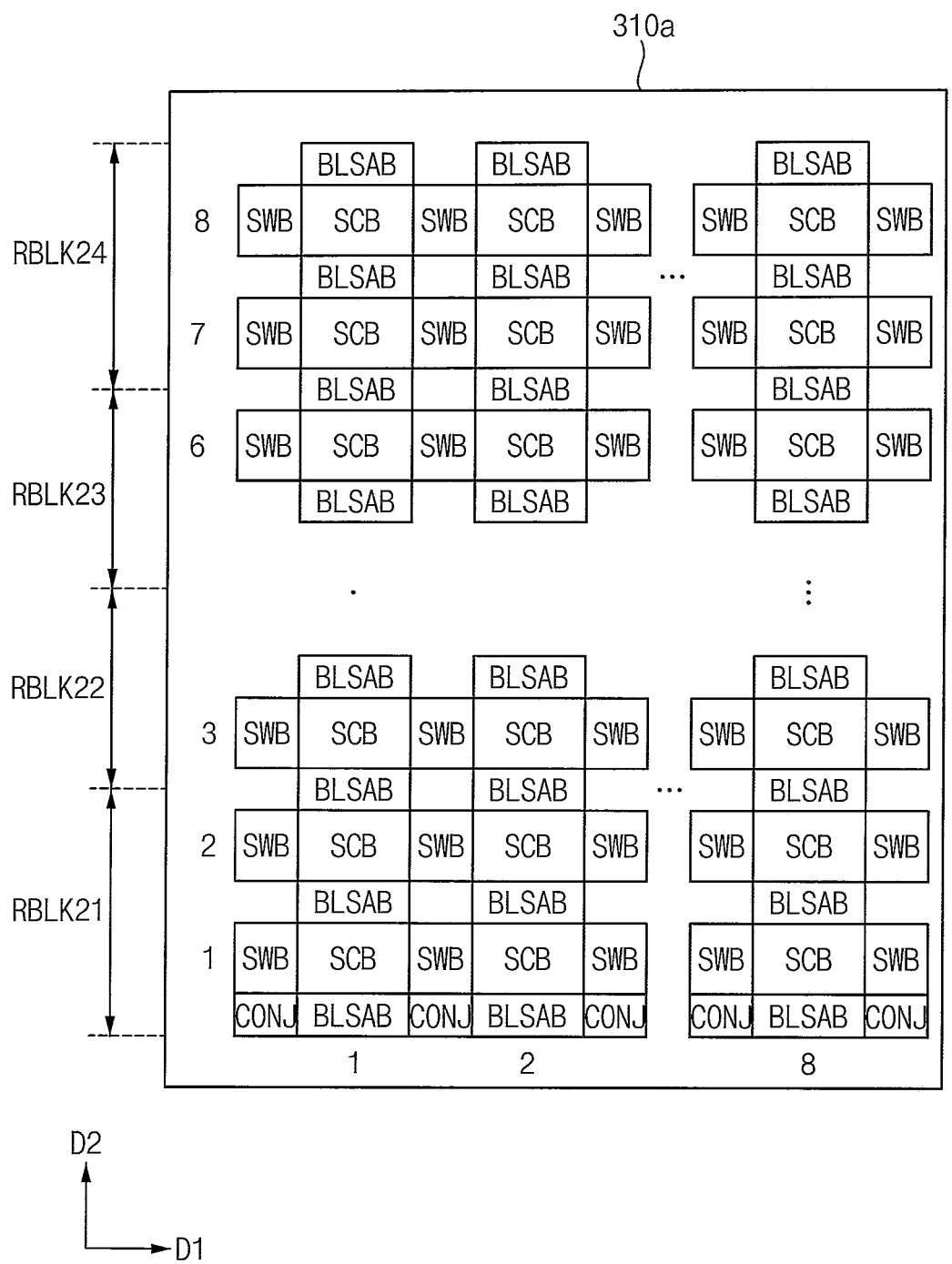

FIGS. 10B and 10C illustrate that the sub array blocks in the first bank array are divided into row blocks by one or more row block identity bits, respectively.

In FIGS. 10B and 10C, it is assumed that I and J in FIG. 10A is 8.

Referring to FIG. 10B, the sub array blocks SCB may be divided into a first row block RBLK11 and a second row block RBLK12 in the second direction D2 by an upper row block identity bit of the row address SRA.

Referring to FIG. 10C, the sub array blocks SCB may be divided into a first row block RBLK21, a second row block RBLK22, a third row block RBLK23 and a fourth row block RBLK24 in the second direction D2 by upper two row block identity bits of the row address SRA.

For example, when upper three bits of the row address SRA are used as the row block identity bit, the sub array blocks SCB may be divided into first through eighth row blocks in the second direction D2.

The first row decoder 260 may be configured to provide the timing/voltage control circuit 500 with information on a row block including the target memory cell using the row block information signal RBIN.

Figure 11:
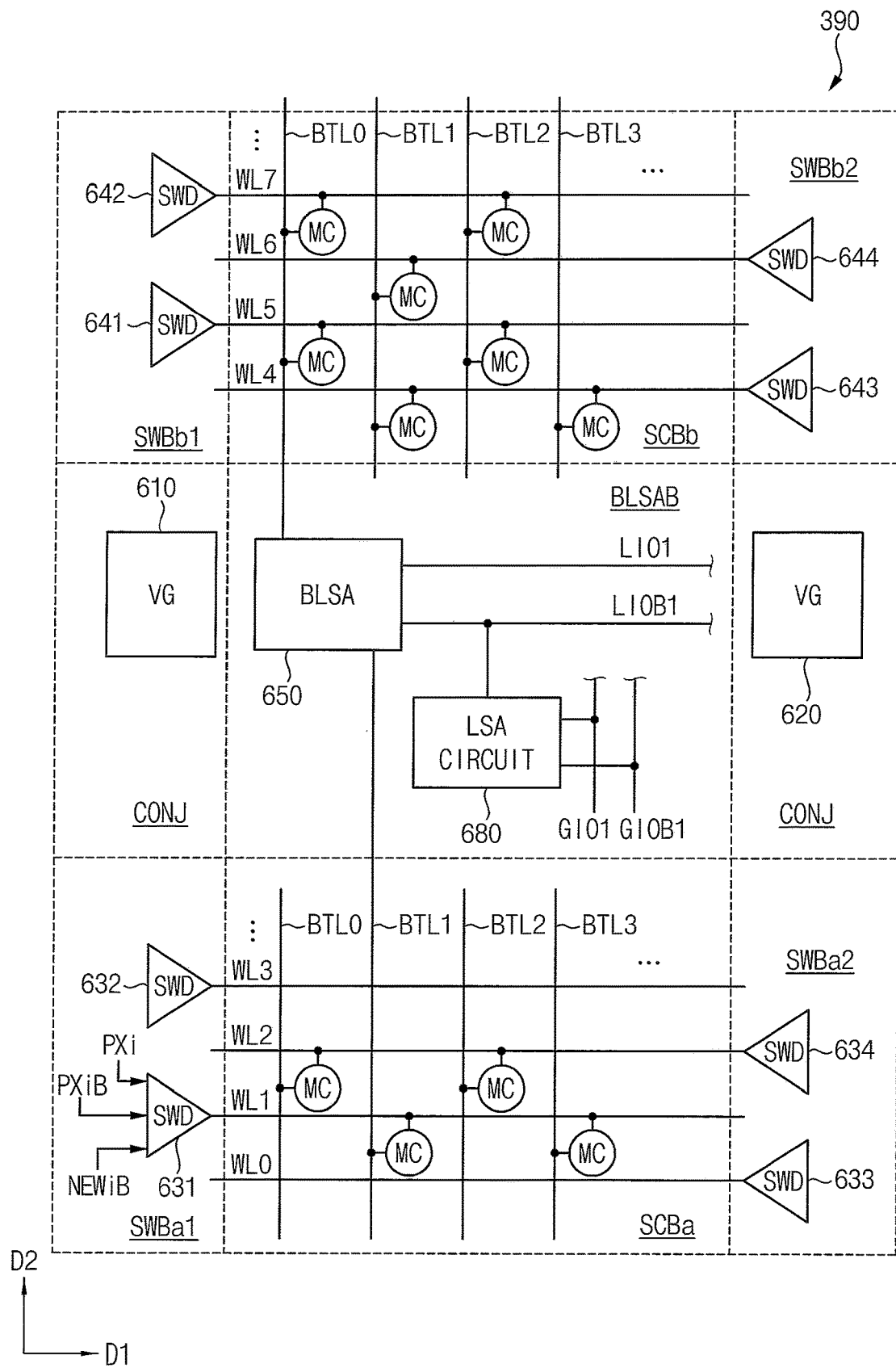
FIG. 11 illustrates a portion of the first bank array of FIG. 10A according to some example embodiments.

FIG. 11 illustrates a portion of the first bank array in FIG. 10A according to some example embodiments.

Referring to FIGS. 10A and 11, sub-array blocks SCBa and SCBb, the bit-line sense amplifier regions BLSAB, four sub word-line driver regions SWBa1, SWBa2, SWBb1 and SWBb2, and two of the conjunction regions CONJ are disposed in the portion 390 of the first bank array 310a.

The sub-array block SCBa may include a plurality of word-lines WL0~WL3 extending in the first direction D1 and a plurality of bit-line BTL0~BTL3 extending in the second direction D2. The sub-array block SCBa may include a plurality of memory cells MCs disposed at intersections of the word-lines WL0~WL3 and the bit-line BTL0~BTL3. The sub-array block SCBb may include a plurality of word-lines WL4~WL7 extending in the first direction D1 and the plurality of bit-line BTL0~BTL3 extending in the second direction D2. The sub-array block SCBb may include a plurality of memory cells MCs disposed at intersections of the word-lines WL4~WL7 and the bit-line BTL0~BTL3.

With reference to FIG. 11, the sub word-line driver regions SWBa1 and SWBa2 may include a plurality of sub word-line drivers 631, 632, 633 and 634 that respectively are configured to drive the word-lines WL0~WL3. The sub word-line driver regions SWBb1 and SWBb2 may include a plurality of sub word-line drivers 641, 642, 643 and 644 that respectively are configured to drive the word-lines WL4~WL7. The sub word-line driver 641 may be configured to control a voltage level of the word-line WL1 in response to the first and second word-line control signals PXi and PXiB. Each of the 632, 633, 634, 641, 642, 643 and 644 may be configured to control a voltage level of a corresponding word-line in response to the first and second word-line control signals PXi and PXiB.

The bit-line sense amplifier region BLSAB may include a bit-line sense amplifier BLSA 650 coupled to the bit-line BTL0 in the sub array block SCBb and the bit-line BTL1 in the sub array block SCBa, and a local sense amplifier LSA circuit 680. The bit-line sense amplifier 650 may be configured to sense and amplify a voltage difference between the bit-lines BTL0 and BTL1 to provide the amplified voltage difference to a local I/O line pair LIO1 and LIOB1.

The local sense amplifier circuit 680 may be configured to control electrical connection between the local I/O line pair LIO1 and LIOB1 and a global I/O line pair GIO1 and GIOB1.

As illustrated in FIG. 11, the conjunction regions CONJ may be disposed adjacent to the bit-line sense amplifier region BLSAB and the sub word-line driver regions SWBa1, SWBb1, SWBa2 and SWBb2. Voltage generators 610 and 620 may be disposed in the conjunction regions CONJ.

Figure 12:
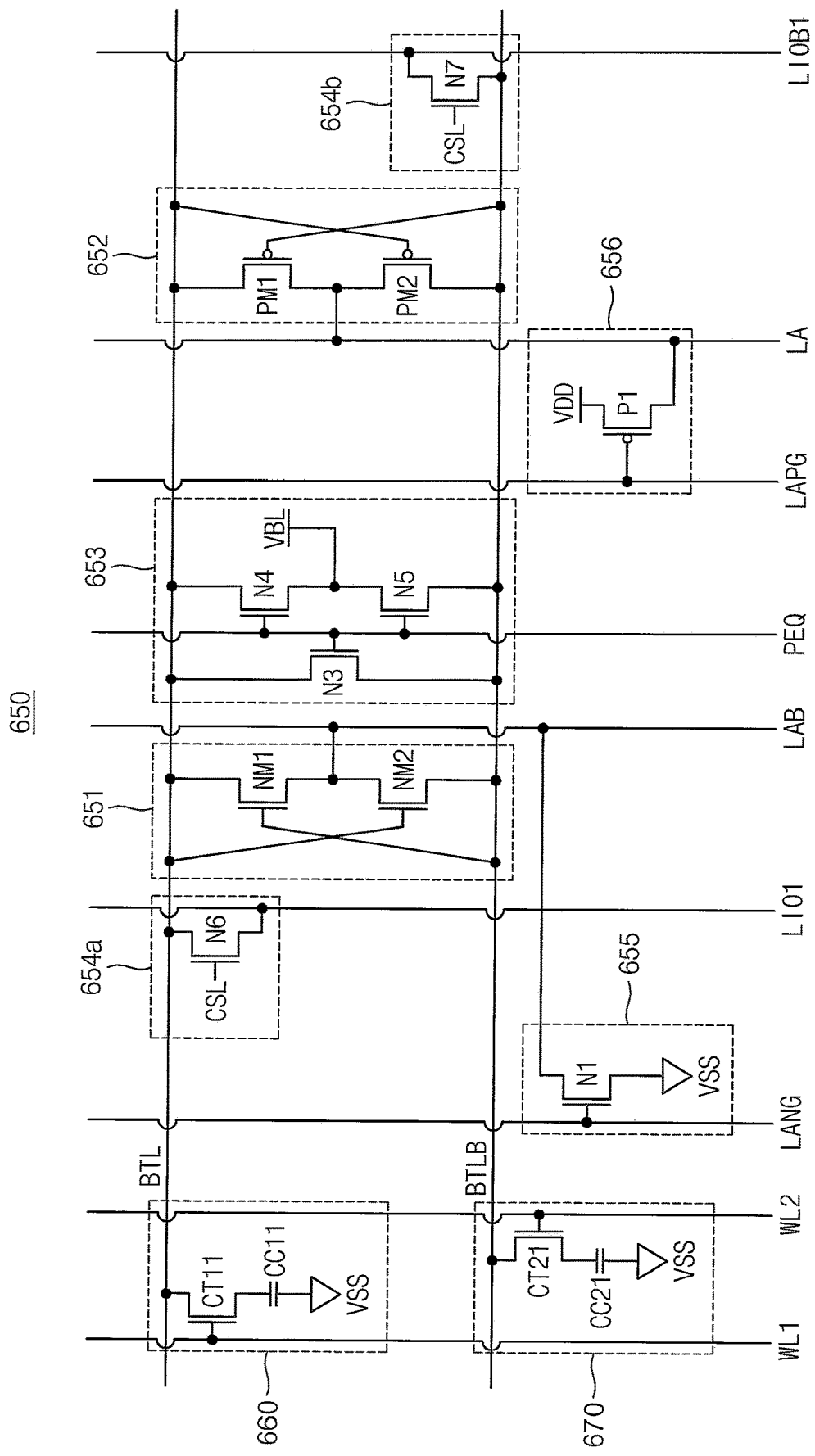
FIG. 12 is a circuit diagram illustrating the bit-line sense amplifiers of FIG. 11 according to example embodiments.

FIG. 12 is a circuit diagram illustrating the bit-line sense amplifiers of FIG. 11 according to example embodiments.

Referring to FIG. 12, the bit-line sense amplifier (BLSA) 650 is coupled to bit-lines BTL1 and BTLB1 of each of memory cells 660 and 670 in the memory cell array 310. Memory cell 660 may correspond to the memory cell MC of sub-array block SCB that is at the intersection of bit line BTL1 and word line WL1, and memory cell 670 may correspond to the memory cell MC of sub-array block SCB that is located at the intersection of bit line BTLB1 and word line WL2. The bit-line sense amplifier 650 shown in FIG. 11 includes an N-type sense amplifier 651, a P-type sense amplifier 652, a pre-charge circuit 653, column select switches 654*a* and 654*b*, an N-type sense amplifier (NSA) driver 655, and a P-type sense amplifier (PSA) driver 656.

The N-type sense amplifier 651 discharges a low-level bit-line of the bit-lines (or, bit-line pair) BL1 and BLB1 to a low level during a sensing operation. The N-type sense amplifier 651 includes two NMOS transistors NM1 and NM2. A gate of the NMOS transistor NM1 is connected to the bit-line (second bit-line) BTLB1, and a drain of the NMOS transistor NM1 is connected to the bit-line (first bit-line) BL1, and a source of the NMOS transistor NM1 is connected to a sense enable line LAB. The NMOS transistor NM2 has a gate connected to the bit-line BL1, a drain connected to the sense enable line LAB, and a source connected to the bit-line BLB1. The N-type sense amplifier 651 connects a low-level bit-line to the sense enable line LAB. The sense enable line LAB is connected to the ground voltage VSS.

The P-type sense amplifier 652 charges a high-voltage bit-line of the bit-lines BL1 and BLB1 with a power supply voltage VDD level during a sensing operation. The P-type sense amplifier 652 includes two PMOS transistors PM1 and PM2. The PMOS transistor PM1 has a gate connected to the bit-line BTLB1, a source connected to the bit-line BL1, and a drain connected to a sense enable line LA. The PMOS transistor PM2 has a gate connected to the bit-line BTL1, a source connected to sense enable line LA, and a drain connected to the bit-line BTLB1.

The P-type sense amplifier 652 charges a high-voltage bit-line of the bit-lines BTL1 and BTLB1 with a power supply voltage VDD provided to the sense enable line LA.

The PSA driver 656 provides a charging voltage VDD to the sense enable line LA. Therefore, the transistor PM2 is turned off because the gate of the transistor PM2 is coupled to the bit-line BTL1 with a voltage increased by the charge sharing.

The pre-charge circuit 653 pre-charges the bit-lines BTL1 and BTLB1 with a half voltage VDD/2 in response to a control signal PEQ in a sensing operation. When the control signal PEQ is activated, the pre-charge circuit 653 supplies a bit-line pre-charge voltage VBL to the bit-lines BTL1 and BTLB1. The bit-line pre-charge voltage VBL may be a half voltage VDD/2. The bit-lines BTL1 and BTLB1 are connected, such that their voltages are equalized. If the bit-lines BTL1 and BTLB1 are charged by the pre-charge level VBL, the control signal PEQ is inactivated. The pre-charge circuit 653 includes NMOS transistors N3, N4, and N5.

The column select switches 654*a* and 654*b* provide data sensed by the N-type and P-type sense amplifiers 651 and 652 to local I/O lines LIO1 and LIOB1 in response to a column selection signal CSL. The column select switches 654*a* and 654*b* are turned on such that the sensed data is transferred to the local I/O lines LIO1 and LIOB1. For example, in a read operation when sensing levels of the N-type and P-type sense amplifiers 651 and 652 are stabilized, a column selection signal CSL is activated. Then the column select switches 654*a* and 654*b* are turned on, such that the sensed data is transferred to the local I/O line pair LIO1 and LIOB1. Voltages of the bit-lines BTL1 and BTLB1 are varied when charges of bit-lines BL1 and BLB1 are shared with the local I/O lines LIO1 and LIOB1. The column select switches 654*a* and 654*b* includes NMOS transistors N6 and N7, respectively.

The NSA driver 655 provides a driving signal to the sense enable line LAB of the N-type sense amplifier 651. Based on the control signal LANG, the NSA driver 655 grounds the sense enable line LAB. The NSA driver 655 includes the ground transistor N1 to control a voltage of the sense enable line LAB. The PSA driver 656 provides the charge voltage VDD to the sense enable line LA of the P-type sense amplifier 652. The PSA driver 656 includes the PMOS transistor P1 to control a voltage of the sense enable line LA. The control signals LAPG and LANG are complementary to each other.

Figure 13:
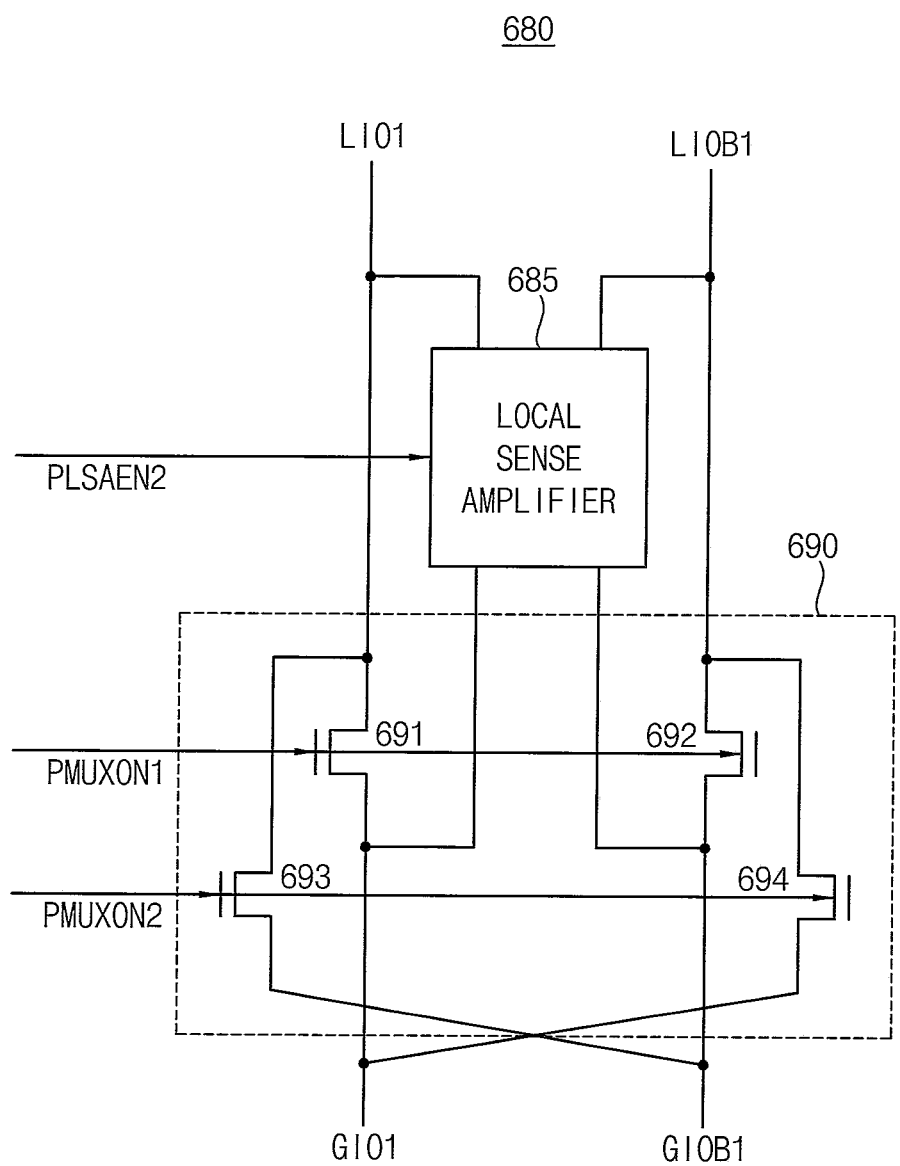
FIG. 13 illustrates the local sense amplifier circuit of FIG. 11 according to example embodiments.

FIG. 13 illustrates the local sense amplifier circuit of FIG. 11 according to example embodiments.

Referring to FIG. 13, the local sense amplifier circuit 680 may include a local sense amplifier 685 and a local I/O line controller 690.

The local sense amplifier 685 may amplify a voltage difference between the local I/O line pair LIO1 and LIOB1 in response to a local sense enable signal PLSAEN2 to provide the amplified voltage difference to a global I/O line pair GIO1 and GIOB1. The local I/O line controller 690 includes first through fourth NMOS transistors 691, 692, 693 and 694, and controls connection between the local I/O line pair LIO1 and LIOB1 and the global I/O line pair GIO1 and GIOB1 in response to a first connection control signal PMUXON1 and a second connection control signal PMUXON2.

For example, when each of the local sense enable signal PLSAEN2, a first connection control signal PMUXON1, and a second connection control signal PMUXON2 is at a low level, the local sense amplifier 685 is disabled and the local I/O line controller 690 cuts off the connection between the local I/O line pair LIO1 and LIOB1 and the global I/O line pair GIO1 and GIOB1.

For example, when each of the local sense enable signal PLSAEN1, the first connection control signal PMUXON1, and the second connection control signal PMUXON2 is at a high level the local sense amplifier 685 is enabled and the local I/O line controller 690 provides the connection between the local I/O line pair LIO1 and LIOB1 and the global I/O line pair GIO1 and GIOB1.

Figure 14:
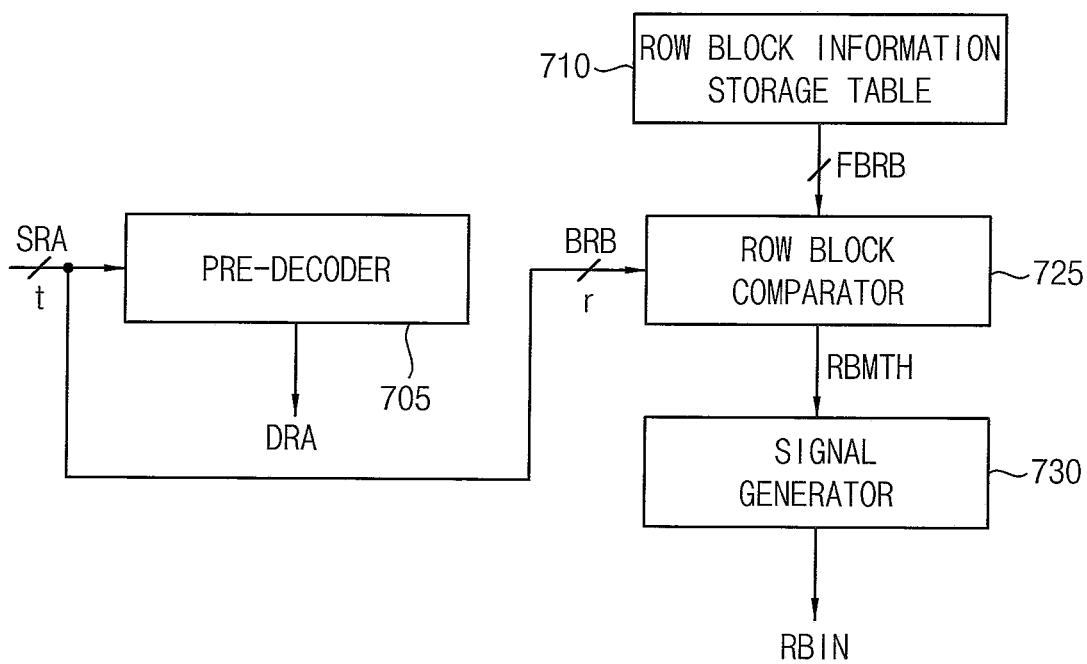
FIG. 14 is a block diagram illustrating a first row block fuse circuit of the row block fuse circuits of FIG. 10A according to example embodiments.

FIG. 14 is a block diagram illustrating a first row block fuse circuit of the row block fuse circuits of FIG. 10A according to example embodiments.

Each configuration of the row block fuse circuits 702-70J may be substantially the same as or similar to a configuration of the first row block fuse circuit 701.

Referring to FIG. 14, the first row block fuse circuit 701 may include a pre-decoder 705, a row block information storage table 710, a row block address comparator 725, and a signal generator 730.

The pre-decoder 705 is configured to decode the row address SRA to provide the decoded row address DRA to a corresponding sub word-line driver. The corresponding sub word-line driver may activate a word-line corresponding to the decoded row address DRA in response to the decoded row address DRA.

The row block information storage table 710 may be configured to store defective row address FBRB associated with a defective row block including the at least one defective cell.

The row block information storage table 710 may be configured to provide the defective row address FBRB to the row block address comparator 425, and the row block comparator 425 may be configured to compare row block identity bits BRB with the defective row block address FBRB to provide the signal generator 430 with a row block match signal RBMTH indicating a result of the comparison of the row block identity bits and with the defective row block address FBRB. When the row address SRA includes t-bits, upper r-bits of the row address SRA may correspond to the row block identity bits BRB.

The signal generator 730 may provide the row block information signal RBIN to the timing/voltage control circuit 500 in response to the row block match signal RBMTH. The row block information signal RBIN may include distance information of a corresponding row block in the second direction and repair information indicating that the corresponding row block includes at least one defective cell.

Figure 15:
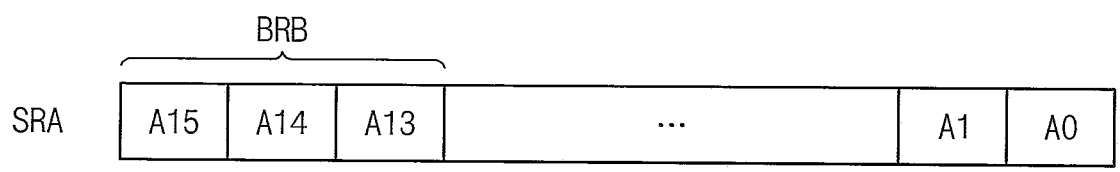
FIG. 15 illustrates an example of the row address of FIG. 14.

FIG. 15 illustrates an example of the row address in FIG. 14.

In FIG. 15, it is assumed that the row address SRA includes 16-bits A0~A15.

Referring to FIG. 15, the upper 3-bits A15~A13 of the row address SRA may be designated as the row block identity bits BRB. In this case, the sub array blocks SCB in FIG. 9A may be divided into eight row blocks disposed in the second direction D2.

FIG. 16 is a block diagram illustrating a first repair circuit of the repair circuits in FIG. 10A according to example embodiments.

Each configuration of the repair circuits 802-80J may be substantially the same as or similar to a configuration of the first repair circuit 801.

Referring to FIG. 16, the first repair circuit 801 may include a fail address storage table 810, a column address comparator 815, a fuse circuit 820, a second signal generator 830, and a repair signal generator 840.

The fail address storage table 810 may be configured to store fail column address information FCAI associated with column address information of defective cells of a corresponding row block. The column address comparator 815 may be configured to compare the column address COLO_ADDR with the fail column address information FCAI to output a column match signal CMTH to the fuse circuit 820 and the repair signal generator 840.

The fuse circuit 820 includes a plurality of fuse sets 821, 822, and 823. The fuse sets 821, 822, and 823 may correspond to the sub array blocks constituting a corresponding row block. Each of the plurality of fuse sets 821, 822, and 823 may include a first region 821a and a second region 821b. The first region 821a may be configured to store spare bit-line information SBI on a spare bit-line to repair one or more defective cells in each of the sub array blocks in the corresponding row block and the second region 821b may store a master fuse bit MFB associated with a usability of a spare bit-line of the corresponding sub array block (usability of a spare bit-line in different sub array block). The fuse circuit 820 may be configured to provide the spare bit-line information SBI and the master fuse bit MFB to the second signal generator 830 and may be configured to provide the master fuse bit MFB to the repair signal generator 840, in response to the column match signal CMTH.

The second signal generator 830 may be configured to generate the local sense enable signal PLSAEN2 for activating a corresponding local sense amplifier based on the second driving control signal LDC, the spare bit-line information SBI and the master fuse bits MFB.

The repair signal generator 840 may be configured to selectively activate the repair signal CREN based on the column match signal CMTH, the master fuse bits MFB, and the repair information RPIN. For example, when the column match signal CMTH indicates that the column address CADDR does not match the fail column address information FCAI, the repair signal generator 840 deactivates the repair signal CREN with a low level. When the repair signal CREN is deactivated, the first sub column decoder 751 in FIG. 9A may activate the column selection line CSL.

For example, when the column match signal CMTH indicates the column address CADDR matches the fail column address information FCAI and the master fuse bit MFB has a low level indicating that a spare bit-line in a corresponding sub array block is usable, the repair signal generator 840 activates the repair signal CREN with a high level. In this case, the first sub column decoder 851 in FIG. 9A selects the spare column selection line SCSL and a spare bit-line in the corresponding row block may be selected by the spare column selection line SCSL.

Figure 17:
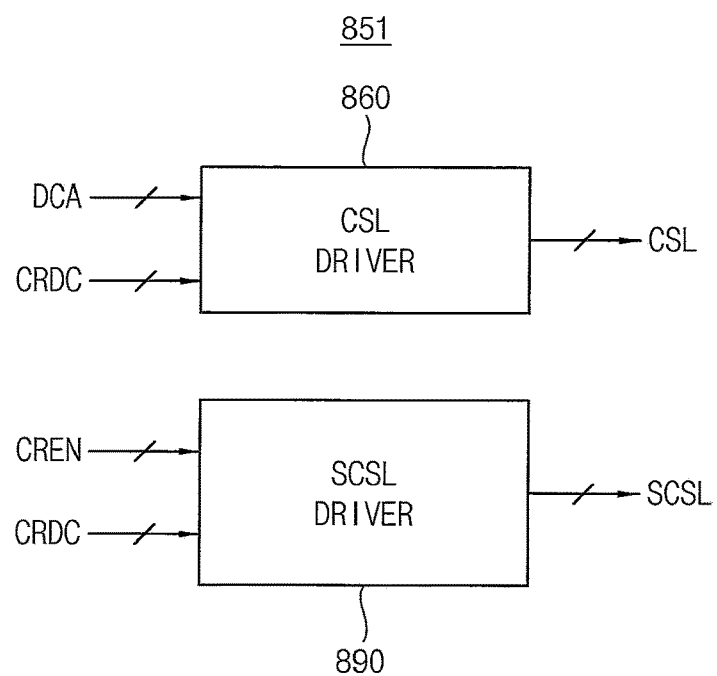
FIG. 17 is a block diagram illustrating a first sub column decoder of the sub column decoders of FIG. 10A according to example embodiments.

FIG. 17 is a block diagram illustrating a first sub column decoder of the sub column decoders of FIG. 10A according to example embodiments.

Each configuration of the sub column decoders 852-85J may be substantially the same as or similar to a configuration of the first sub column decoder 851.

Referring to FIG. 17, the first sub column decoder 851 may include a column selection line (CSL) driver 860, and a spare column selection line (SCSL) driver 865.

The column selection line driver 860 may be configured to select one of the column selection lines CSL in response to the decoded column address DCA and the first driving control signal CRDC. The column selection line driver 860 may be configured to adjust a voltage level that drives a selected column selection line or a current driving capability associated with driving the selected column selection line based on bits of the first driving control signal CRDC.

The spare column selection line driver 865 may be configured to select the spare column selection line SCSL in response to the repair signal CREN and the first driving control signal CRDC and may be configured to adjust a voltage level that drives a selected spare column selection line or a current driving capability associated with driving the selected spare column selection line based on bits of the first driving control signal CRDC.

Figure 18:
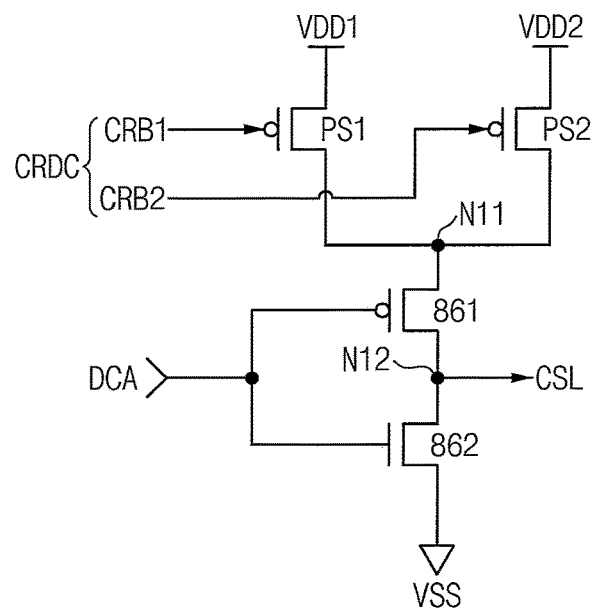
FIGS. 18 and 19 are circuit diagrams illustrating examples of the column selection line driver of FIG. 17 according to example embodiments, respectively.
Figure 19:
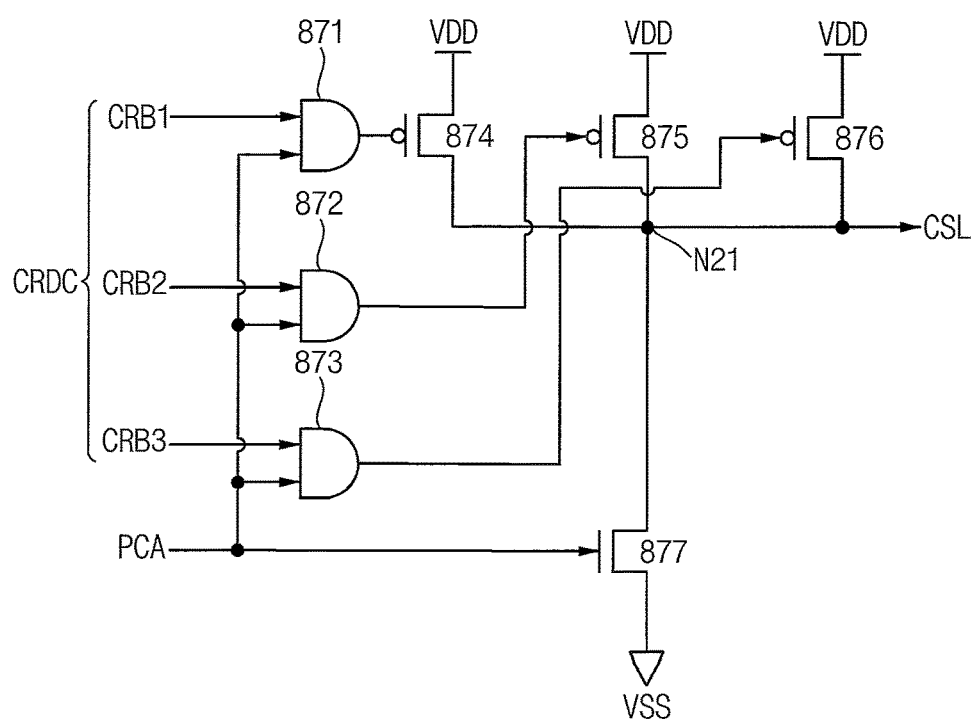

FIGS. 18 and 19 are circuit diagrams illustrating examples of the column selection line driver in FIG. 17 according to example embodiments, respectively.

In FIGS. 18 and 19, it is assumed that, the sub array blocks are divided into the first row block RBLK21, the second row block RBLK22, the third row block RBLK23, and the fourth row block RBLK24 in the second direction D2 as illustrated in FIG. 10C, a first memory cell is disposed in the first row block RBLK21, a second memory cell is disposed in the second row block RBLK22, a third memory block is disposed in one of the third row block RBLK23 and the fourth row block RBLK24, and the first through third memory cells are connected to a first bit-line. A distance of the first memory cell in the second direction is relatively short with respect to a reference position, a distance of the second memory cell in the second direction is relatively short with respect to the reference position, and a distance of a third memory cell is greater than the distance of the second memory cell in the second direction with respect to the reference position.

Referring to FIG. 18, a column selection line driver 860a may include a first power switch PS1, a second power switch PS2, a p-channel metal-oxide semiconductor (PMOS) transistor 861, and an n-channel metal-oxide semiconductor (NMOS) transistor 862.

The first power switch PS1 may include a source coupled to a first power supply voltage VDD, a gate configured to receive a first bit CRDC1 of the first driving control signal CRDC, and a drain coupled to a first node N11. The second power switch PS2 may include a source coupled to a second power supply voltage VDD2 greater than the first power supply voltage VDD1, a gate configured to receive a second bit CRDC2 of the first driving control signal CRDC, and a drain coupled to the first node VDD.

The PMOS transistor 861 may include a source coupled to the first node N11, a gate configured to receive a decoded column address DCA which is generated based on the column address COL_ADDR, and a drain coupled to a second node N12. The NMOS transistor 862 may include a drain coupled to the second node N12, a gate configured to receive the decoded column address DCA, and a source coupled to a ground voltage VS S. The PMOS transistor 861 and the NMOS transistor 862 may constitute an inverter and the column selection line driver 860a may be configured to drive the column selection line CSL with voltage of the second node N12.

In response to the first memory cell being accessed by the decoded column address DCA and the row address SRA, the timing/voltage control circuit 500 may drive the column selection line CSL based on a level of the first power supply voltage VDD1 by turning-on the first power switch PS1 and turning-off the second power switch PS2 using the first driving control signal CRDC. In response to the second memory cell being accessed by the decoded column address DCA and the row address SRA, the timing/voltage control circuit 500 may drive the column selection line CSL based on a level of the second power supply voltage VDD2 by turning-off the first power switch PS1 and by turning-on the second power switch PS2 using the first driving control signal CRDC.

In response to the first memory cell being accessed by the decoded column address DCA and the row address SRA, the timing/voltage control circuit 500 may drive the column selection line CSL based on a level of the first power supply voltage VDD1 and a level of the second power supply voltage VDD2 by turning-on the first power switch PS1 and by turning-on the second power switch PS2 using the first driving control signal CRDC.

Referring to FIG. 19, a column selection line driver 860b may include a first AND gate 871, a second AND gate 872, a second AND gate 873, a first PMOS transistor 874, a second PMOS transistor 875, a third PMOS transistor 876, and an NMOS transistor 877.

The first AND gate 871 may be configured to perform an AND operation on a first bit CRDC1 of the first driving control signal CRDC and the decoded column address DCA. The second AND gate 872 may be configured to perform an AND operation on a second bit CRDC2 of the first driving control signal CRDC and the decoded column address DCA. The third AND gate 873 may be configured to perform an AND operation on a third bit CRDC3 of the first driving control signal CRDC and the decoded column address DCA.

The first through third PMOS transistors 874, 875, and 876 may be connected in parallel between a power supply voltage VDD and a first node N21. The first PMOS transistor 874 may include a source coupled to the power supply voltage VDD, a gate configured to receive an output of the first AND gate 871, and a drain coupled to the first node N21. The second PMOS transistor 875 may include a source coupled to the power supply voltage VDD, a gate configured to receive an output of the second AND gate 872, and a drain coupled to the first node N21. The third PMOS transistor 876 may include a source coupled to the power supply voltage VDD, a gate configured to receive an output of the third AND gate 873, and a drain coupled to the first node N21.

Each size of the first through third PMOS transistors 874, 875, and 876 may be the same and each of the first through third PMOS transistors 874, 875, and 876 may have the same current driving capability.

The NMOS transistor 877 may include a drain coupled to the first node N21, a gate configured to receive the decoded column address DCA, and a source coupled to a ground voltage VSS. The column selection line driver 860b may be configured to drive the column selection line CSL with a voltage of the first node N21.

In response to the first memory cell being accessed by the decoded column address DCA and the row address SRA, the timing/voltage control circuit 500 may drive the column selection line CSL based on a current driving capability of the first PMOS transistor 874 by turning-on the first PMOS transistor 874 and turning-off the second PMOS transistor 875 and the third PMOS transistor 876 using the first driving control signal CRDC. In response to the second memory cell being accessed by the decoded column address DCA and the row address SRA, the timing/voltage control circuit 500 may drive the column selection line CSL based on a current driving capability of the first PMOS transistor 874 and the second PMOS transistor 875 by turning-on the first PMOS transistor 874 and the second PMOS transistor 875 and by turning-off the third PMOS transistor 876 using the first driving control signal CRDC.

In response to the third memory cell being accessed by the decoded column address DCA and the row address SRA, the timing/voltage control circuit 500 may drive the column selection line CSL based on a current driving capability of the first PMOS transistor 874, the second PMOS transistor 87,5 and the third PMOS transistor 876 by turning-on the first PMOS transistor 874, the second PMOS transistor 875 and the third PMOS transistor 876 using the first driving control signal CRDC.

Figure 20:
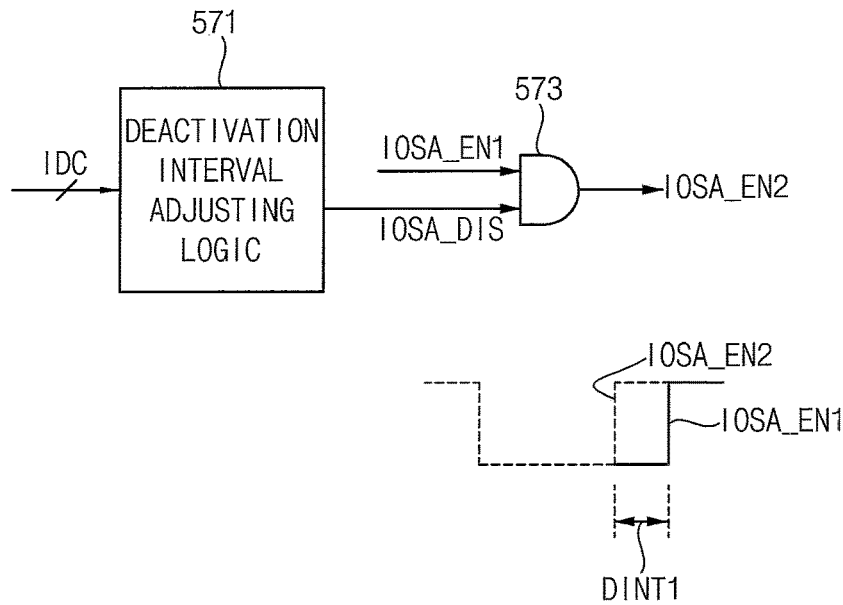
FIG. 20 is a block diagram illustrating the first signal generator of FIG. 9 according to example embodiments.

FIG. 20 is a block diagram illustrating the first signal generator in FIG. 9 according to example embodiments.

Referring to FIG. 20, the first signal generator 570 may include a deactivation interval adjusting logic 571 and an AND gate 573.

The deactivation interval adjusting logic 571 may be configured to generate a deactivation interval signal IOSA_DIS to adjust a deactivation interval of the I/O sense enable signal IOSA_EN2 based on the third driving control signal IDC. The AND gate 573 may be configured to perform an AND operation on the deactivation interval signal IOSA_DIS and a first I/O sense enable signal IOSA_EN1 having a fixed activation interval to output the I/O sense enable signal IOSA_EN2.

The deactivation interval adjusting logic 571 may be configured to adjust a difference DINT1 between activation intervals of the first I/O sense enable signal IOSA_EN1 and the I/O sense enable signal IOSA_EN2 based on the third driving control signal IDC and may decrease the difference DINT1 as the distance in the second direction D2 from a reference position increases. The second decision logic 560 in FIG. 9 may generate the third driving control signal IDC, such that a first activation interval of the I/O sense enable signal associated with accessing the first memory cell is smaller than a second activation interval of the I/O sense enable signal associated with accessing the second memory cell. The activation interval of the first I/O sense enable signal IOSA_EN1 may be determined based on an I/O sense amplifier associated with a row block whose distance in the second direction from the reference position is greatest.

Figure 21:
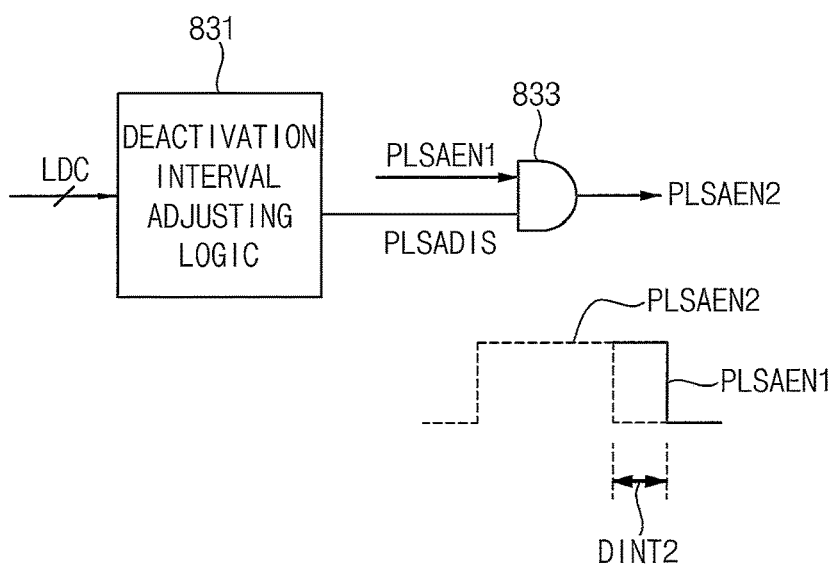
FIG. 21 is a block diagram illustrating the second signal generator of FIG. 16 according to example embodiments.

FIG. 21 is a block diagram illustrating the second signal generator in FIG. 16 according to example embodiments.

Referring to FIG. 21, the second signal generator 830 may include a deactivation interval adjusting logic 831 and an AND gate 833.

The deactivation interval adjusting logic 831 may be configured to generate a deactivation interval signal PLSA-DIS to adjust a deactivation interval of the local sense enable signal PLSAEN2 based on the second driving control signal LDC. The AND gate 833 may be configured to perform an AND operation on the deactivation interval signal PLSADIS and a first local sense enable signal PLSAEN1 having a fixed activation interval to output the local sense enable signal PLSAEN2.

The deactivation interval adjusting logic 831 may be configured to adjust a difference DINT2 between activation intervals of the first local sense enable signal PLSAEN1 and the local sense enable signal PLSAEN2 based on the second driving control signal LDC and may decrease the difference DINT2 as the distance in the second direction D2 from a reference position increases. The first decision logic 550 in FIG. 9 may generate the second driving control signal LDC such that a first activation interval of the local sense enable signal PLSAEN2 associated with accessing the first memory cell is smaller than a second activation interval of the local sense enable signal PLSAEN2 associated with accessing the second memory cell. The activation interval of the first local sense enable signal PLSAEN1 may be determined based on a local sense amplifier associated with a row block whose distance in the second direction from the reference position is greatest.

Figure 22:
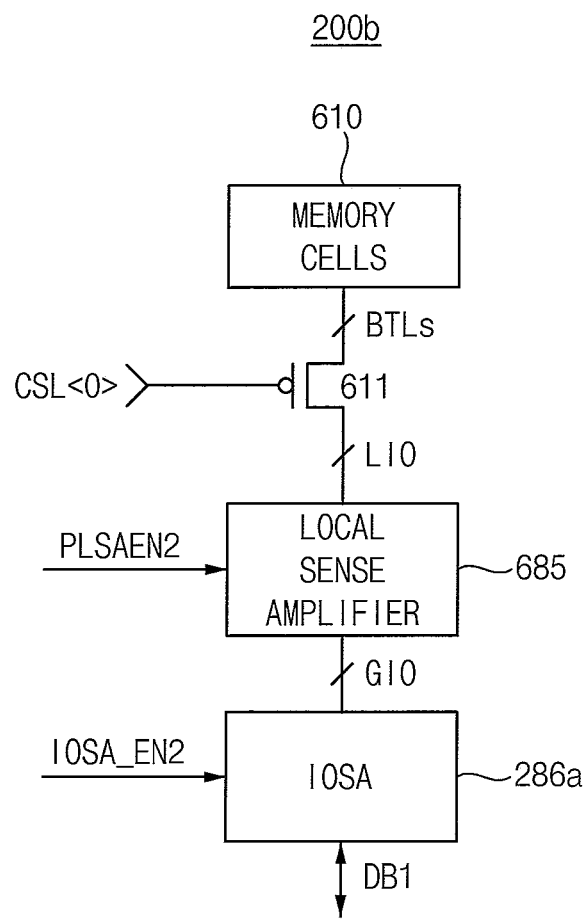
FIG. 22 illustrates a portion of a semiconductor memory device according to example embodiments.

FIG. 22 illustrates a portion of a semiconductor memory device according to example embodiments.

Referring to FIG. 22, a semiconductor memory device 200b may include memory cells 610, a local sense amplifier 685, and an I/O sense amplifier 268a.

Bit-lines BTLs of the memory cells 610 may be connected to the local sense amplifier 685 through a transistor 611 and local I/O line pair LIO and the local sense amplifier 685 may be connected to the I/O sense amplifier 268a through global I/O line pair GIO.

The timing/voltage control circuit 500 in FIG. 10A may be configured to adjust a level of a voltage that drives a column selection line CSL<0>, an activation interval of the local sense enable signal PLSAEN2 that activates the local sense amplifier 685, and an activation interval of the I/O sense enable signal IOSA_EN2 that activates the I/O sense amplifier 268a according to a distance of the row block including the memory cells 610 based on the row block information signal RBIN as described with reference to FIGS. 18 through 21.

The I/O sense amplifier 268a may be configured to sense a voltage difference of the global I/O line pair GIO and output a data bit DB1.

Figure 23:
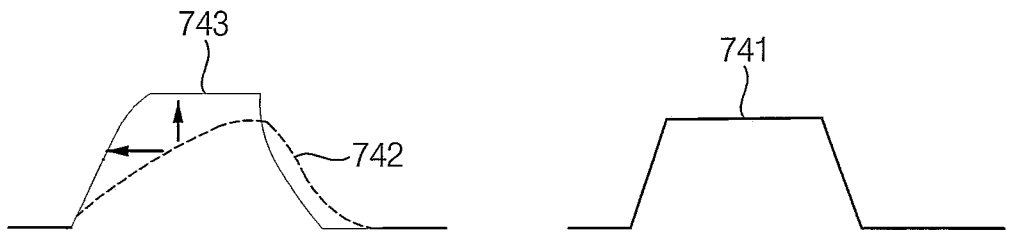
FIG. 23 illustrates that the timing/voltage control circuit adjusts a level of a voltage that drives the column selection line.

FIG. 23 illustrates that the timing/voltage control circuit adjusts a level of a voltage that drives the column selection line.

In FIG. 23, a reference numeral 741 indicates a level of a voltage that drives a column selection line CSL of a first memory cell, a reference numeral 742 indicates that a level of a voltage that drives a column selection line CSL of a second memory cell is not adjusted, and a reference numeral 743 indicates that a level of a voltage that drives the column selection line CSL of the second memory cell is adjusted.

Referring to FIG. 23, when the timing/voltage control circuit 500 controls the column selection line driver 860a, such that a voltage level of the column selection line CSL associated with selecting the second memory cell is greater than a voltage level of the column selection line CSL associated with selecting the first memory cell as described with reference to FIG. 18, the timing/voltage control circuit 500 may reduce current consumption in a read operation by reducing RC loading in a read operation on the second memory cell.

Figure 24:
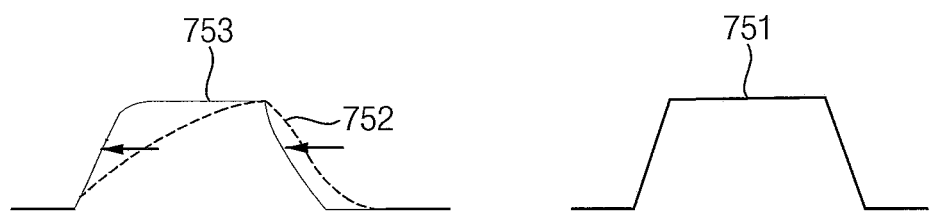
FIG. 24 illustrates that the timing/voltage control circuit adjusts a current driving capability (driving strength) associated with driving the column selection line.

FIG. 24 illustrates that the timing/voltage control circuit adjusts a current driving capability (driving strength) associated with driving the column selection line.

In FIG. 24, a reference numeral 751 indicates a driving voltage of a column selection line CSL of a first memory cell, a reference numeral 752 indicates that a current driving capability of the driving voltage of the column selection line CSL of a second memory cell is not adjusted, and a reference numeral 753 indicates that a current driving capability of the driving voltage of the column selection line CSL of a second memory cell is adjusted.

Referring to FIG. 24, when the timing/voltage control circuit 500 controls the column selection line driver 860b, such that a current driving capability (a driving strength) associated with the column selection line CSL associated with selecting the second memory cell is greater than a current driving capability associated with the column selection line CSL associated with selecting the first memory cell as described with reference to FIG. 19, the timing/voltage control circuit 500 may reduce current consumption in a read operation.

Figure 25:
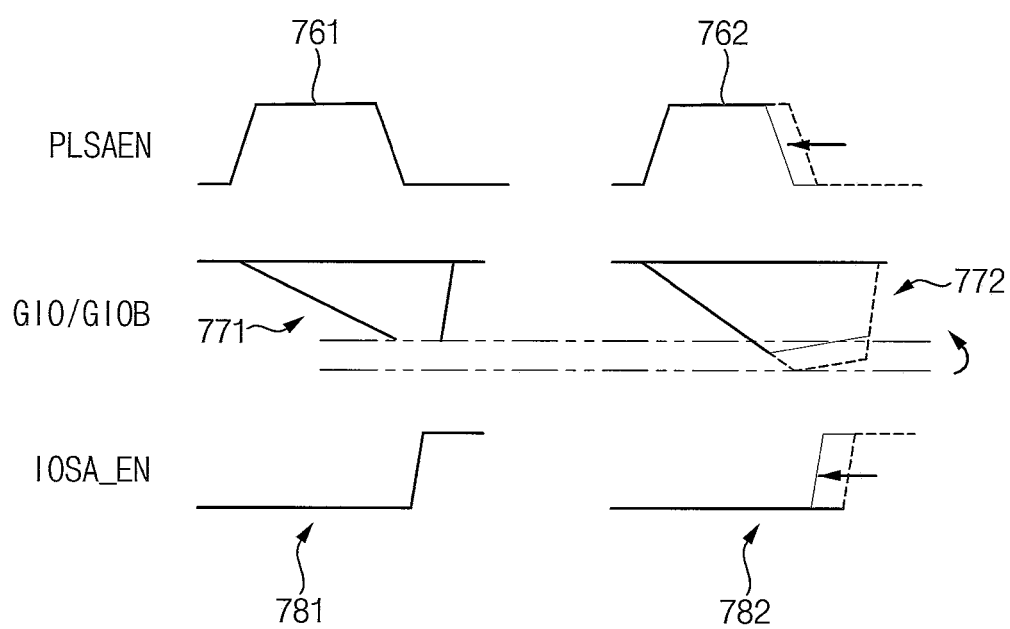
FIG. 25 illustrates that the timing/voltage control circuit adjusts an activation interval of a local sense enable signal and an activation interval of an I/O sense enable signal.

FIG. 25 illustrates that the timing/voltage control circuit adjusts an activation interval of a local sense enable signal and an activation interval of an I/O sense enable signal.

In FIG. 25, a reference numeral 761 indicates a local sense enable signal PLSAEN when accessing a second memory cell, a reference numeral 762 indicates a local sense enable signal PLSAEN when accessing a first memory cell, a reference numeral 771 indicates a voltage difference of global I/O line pair GIO/GIOB when accessing the second memory cell, a reference numeral 772 indicates a voltage difference of global I/O line pair GIO/GIOB when accessing the first memory cell, a reference numeral 781 indicates an I/O sense enable signal IOSA_EN when accessing the second memory cell, and a reference numeral 782 indicates an I/O sense enable signal IOSA_EN when accessing the first memory cell.

Referring to FIG. 25, when the timing/voltage control circuit 500 generates the local sense enable signal PLSAEN and the I/O sense enable signal IOSA_EN, such that each activation interval of the local sense enable signal PLSAEN and the I/O sense enable signal IOSA_EN when accessing the second memory cell is smaller than each activation interval of the local sense enable signal PLSAEN and the I/O sense enable signal IOSA_EN when accessing the first memory cell as described with reference to FIGS. 20 and 21, a voltage difference of the global I/O line pair GIO/GIOB when accessing the first memory cell is smaller than a voltage difference of the global I/O line pair GIO/GIOB when accessing the second memory cell. The timing/voltage control circuit 500 may reduce current consumption due to driving current and a leakage current of the local sense amplifier and the I/O sense amplifier by reducing the operating interval of the local sense amplifier and the I/O sense amplifier.

Figure 26:
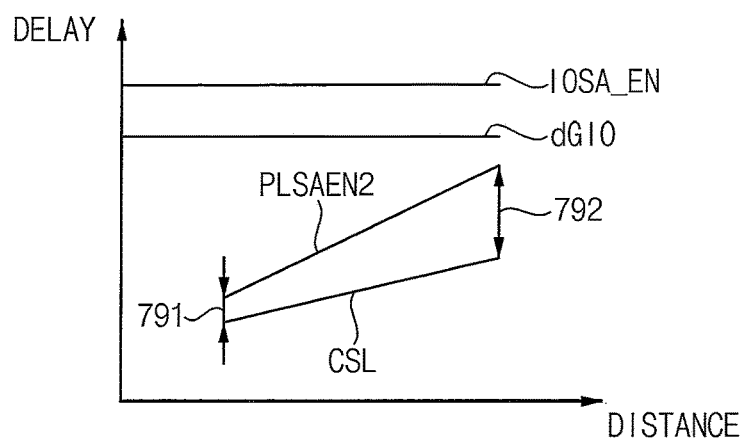
FIG. 26 illustrates various parameters according to a distance of the target row block in the second direction from a reference position in the semiconductor memory device according to example embodiments.

FIG. 26 illustrates various parameters according to a distance of the target row block in the second direction relative to a reference position in the semiconductor memory device according to example embodiments.

In FIG. 26, it is assumed that the activation interval of the I/O sense enable signal IOSA_EN2 and a voltage difference of the global I/O line pair are the same according to a distance of the target row block in the second direction from a reference position.

Referring to FIG. 26, when a driving voltage of the column selection line CSL and an activation interval of the I/O sense enable signal IOSA_EN2 are increased with different slopes according to the distance of the target row block in the second direction from a reference position, a current consumption 791 associated with accessing the first memory cell may be more reduced than a current consumption 792 associated with accessing the second memory cell.

Figure 27:
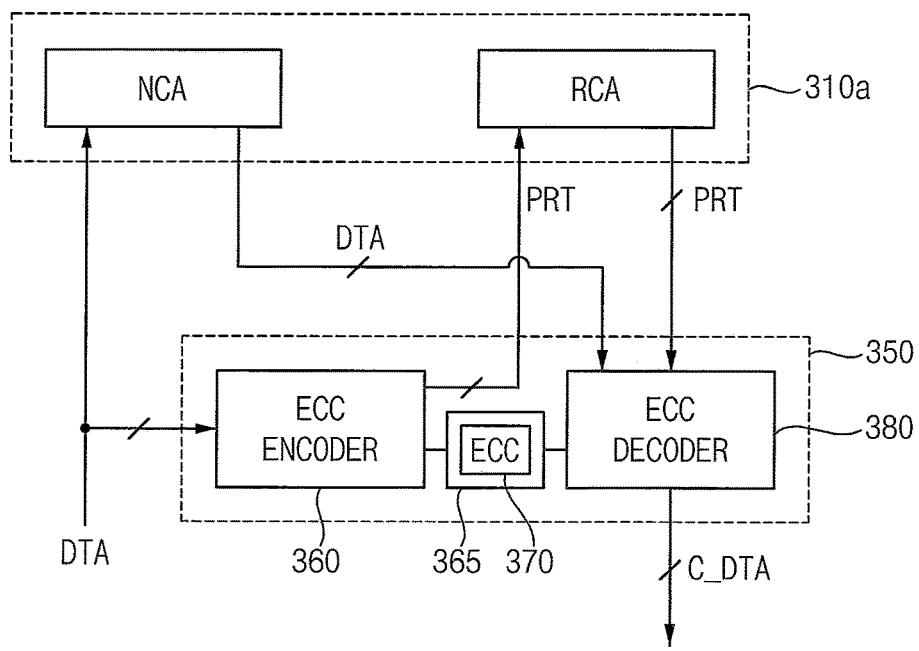
FIG. 27 is a block diagram illustrating an example of the ECC engine in the semiconductor memory device of FIG. 3 according to example embodiments.

FIG. 27 is a block diagram illustrating an example of the ECC engine in the semiconductor memory device of FIG. 3 according to example embodiments.

Referring to FIG. 27, the ECC engine 350 may include an ECC encoder 360, an ECC decoder 380, and an (ECC) memory 365. The memory 365 may be configured to store an ECC 370. The ECC 370 may be a single error correction (SEC) code or a single error correction/double error detection (SECDED) code.

The ECC encoder 360 may receive the data DTA from the data I/O buffer 320 and be configured to generate parity data PRT using the ECC 370, associated with the data DTA to be stored in the normal cell array NCA of the first bank array 310*a*. The parity data PRT may be stored in the redundancy cell region RCA of the first bank array 310*a*.

The ECC decoder 380 may be configured to perform an ECC decoding operation on a read data RMD based on the read data RMD and the parity data PRT read from the first bank array 310*a* using the ECC 370. When the read data RMD includes an error bit as a result of the ECC decoding, the ECC decoder 380 may be configured to correct the error bit in the read data RMD and may provide a corrected data C_DTA to the data I/O buffer 320.

FIG. 28 illustrates an example command, which may be used in the memory system of FIG. 1.

FIG. 28 illustrates combinations of a chip selection signal CS_n and first through fourteenth command-address signals CA0~CA13 representing an active command ACT, a write command WR, and a read command RD.

In FIG. 28, H indicates a logic high level, L indicates a logic low level, V indicates a valid logic level corresponding to one of the logic high level H and the logic low level L, R0~R17 indicate bits of a row address, BA0 through BA2 indicate bits of a bank address, BG0 through BG2 indicate bits of a bank group address, and CID0 through CID3 indicate die identifier of a memory die (or a memory chip) when the semiconductor memory device 200 is implemented with a stacked memory device including a plurality of memory dies. In addition, in FIG. 28, C2~C10 indicate bits of a column address and BL indicates a burst length flag.

Referring to FIG. 28, the active command ACT, the write command WR and the read command RD may be transferred during two cycles, for example, during the logic high level H and the logic low level L of the chip selection signal CS_n. The active command ACT may include the bank address bits BA0 and BA1 and the row address bits R0~R17.

Figure 29:
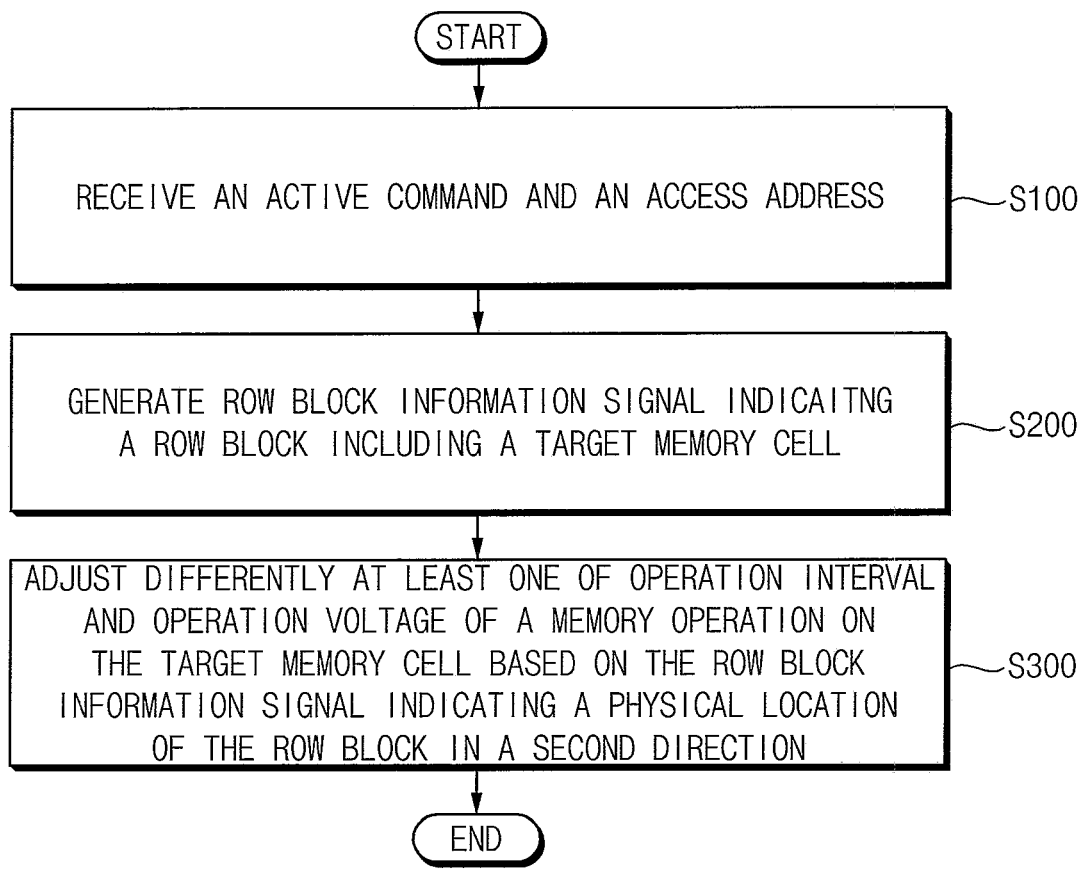
FIG. 29 is a flow chart illustrating a method of operating a semiconductor memory device according to example embodiments.

FIG. 29 is a flow chart illustrating a method of operating a semiconductor memory device according to example embodiments.

Referring to FIGS. 3 through 26 and 29, the semiconductor memory device 200 receives an active command and an access address accompanied by the active command (operation S100). The semiconductor memory device 200 may include a memory cell array 310. The memory cell array 310 may include a plurality of bank arrays, and each of the plurality of bank arrays may include a plurality of volatile memory cells coupled to word-lines and bit-lines. Each of the plurality of bank arrays may be divided into a plurality of row blocks by a row block identity bit corresponding to a portion of bits of a row address, and each of the of row blocks may include a plurality of sub-array blocks arranged in a first direction.

A row decoder 260 coupled to the memory cell array 310 through the word-lines generates a row block information signal RBIN indicating a target row block including a target memory cell based on the access address (operation S200).

A timing/voltage control circuit 500 may adjust at least one of an operation interval and an operation voltage of a memory operation on the target memory cell based on the row block information signal RBIN indicating a distance to the target row block from a column decoder 270 in a second direction crossing the first direction (operation S300).

The row decoder 260 activates a first word-line coupled to a first memory cell from among the plurality of volatile memory cells based on a row address in the access address, activates a second word-line coupled to a second memory cell from among the plurality of volatile memory cells based on the row address and the column decoder 270 accesses the first memory cell and the second memory cell through a first bit-line based on a column address. The timing/voltage control circuit 500 controls the column decoder 270 such that a level of the operation voltage or a driving strength of the operation voltage is increased based on an increase of the distance in the second direction and the operation interval is decreased based on the increase of the distance in the second direction from a reference position, e.g., the column decoder 270 position.

Figure 30:
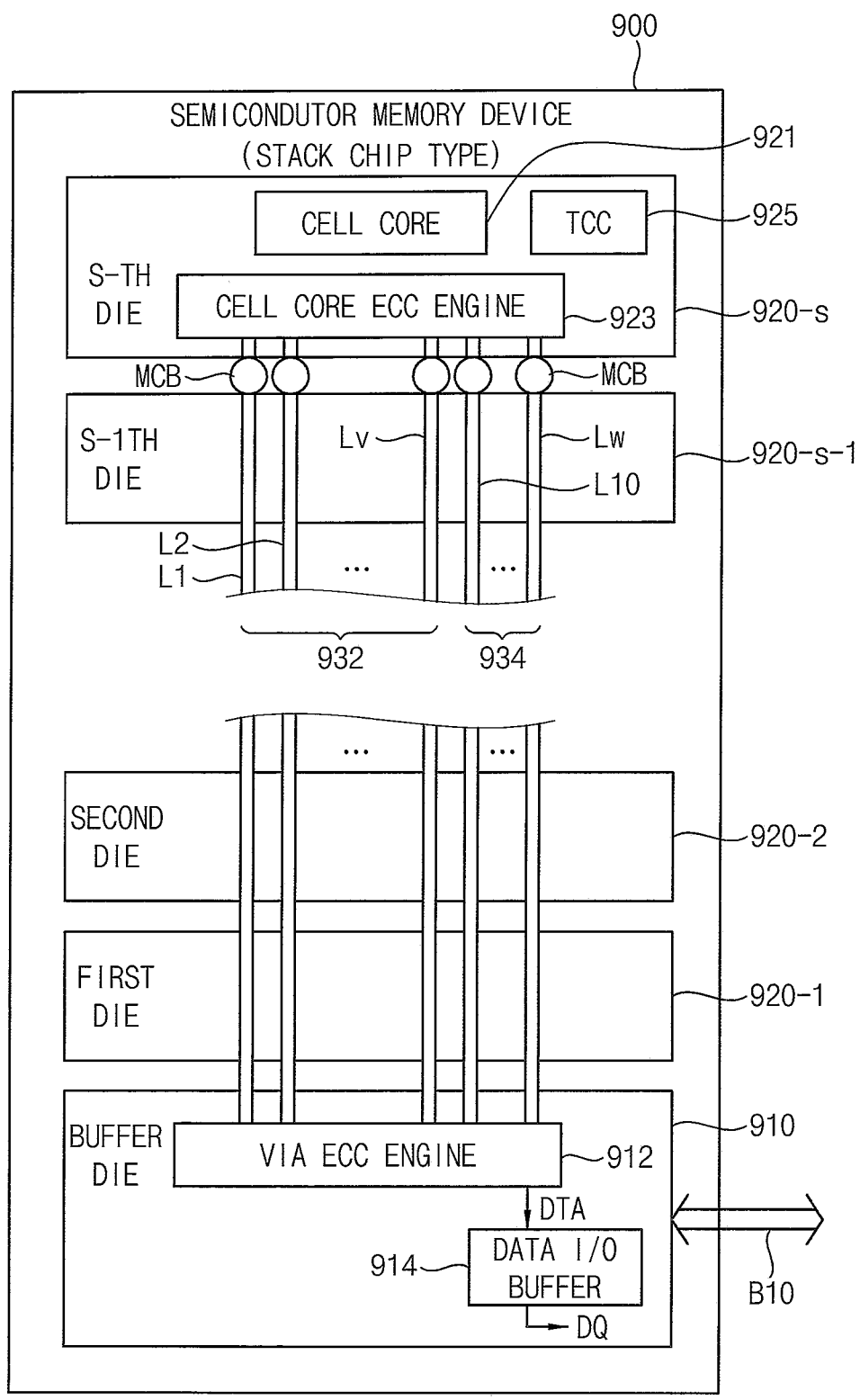
FIG. 30 is a block diagram illustrating a semiconductor memory device according to example embodiments.

FIG. 30 is a block diagram illustrating a semiconductor memory device according to example embodiments.

Referring to FIG. 30, a semiconductor memory device 900 may include at least one buffer die 910 and a plurality of memory dies 920-1 to 920-*p* (p is a natural number equal to or greater than three) configured to provide a soft error analyzing and correcting function in a stacked chip structure.

The plurality of memory dies 920-1 to 920-*p* are stacked on the buffer die 910 and conveys data through a plurality of through silicon via (TSV) lines.

At least one of the memory dies 920-1 to 920-*p* may include a cell core 921 to store data, a cell core ECC engine 923 which is configured to generate transmission parity bits (i.e., transmission parity data) based on transmission data to be sent to the at least one buffer die 910 and a timing/voltage control circuit (TCC) 925. The cell core 921 may include a plurality of memory cells having a DRAM cell structure. The cell core 921 may be divided into a plurality of row blocks by one or more row block identity bits corresponding to a portion of bits of a row address, and each of the of row blocks includes a plurality of sub-array blocks arranged in a first direction.

The timing/voltage control circuit 925 may employ the operation control signal generator 530 in FIG. 9. The timing/voltage control circuit 925 may adjust at least one of an operation interval and an operation voltage of a memory operation on a target memory cell based on a row block information signal indicating a distance of a target memory block including the target memory cell from a column decoder in a second direction, and thus may reduce current consumption and may obtain similar read operation characteristic with respect to memory cells having different distances in the second direction.

The buffer die 910 may include a via ECC engine 912 which is configured to correct a transmission error using the transmission parity bits when a transmission error is detected from the transmission data received through the TSV liens and generates error-corrected data.

The buffer die 910 may further include a data I/O buffer 916. The data I/O buffer 916 may generate the data signal DQ by sampling the data DTA from the via ECC engine 912 and may externally output the data signal DQ.

The semiconductor memory device 900 may be a stack chip type memory device or a stacked memory device, which is configured to convey data and control signals through the TSV lines. The TSV lines may be also called "through electrodes."

The cell core ECC engine 923 may be configured to perform error correction on data which is output from the memory die 920-*p* before the transmission data is sent.

A data TSV line group 932, which is formed at one memory die 920-*p* may include 129 TSV lines L1 and L2 to Lp, and a parity TSV line group 934 may include 9 TSV lines L10 to Lq. The TSV lines L1 and L2 to Lp of the data TSV line group 932 and the parity TSV lines L10 to Lq of the parity TSV line group 934 may be connected to micro bumps MCB which are correspondingly formed among the memory dies 920-1 to 920-*p*.

The semiconductor memory device 900 may have a three-dimensional (3D) chip structure or a 2.5D chip structure to communicate with the host through a data bus B10. The buffer die 910 may be connected with the memory controller through the data bus B10.

According to example embodiments, as illustrated in FIG. 30, the cell core ECC engine 923 may be included in the memory die, the via ECC engine 912 may be included in the buffer die. Accordingly, it may be possible to detect and correct soft data fail. The soft data fail may include a transmission error which is generated due to noise when data is transmitted through TSV lines.

Figure 31:
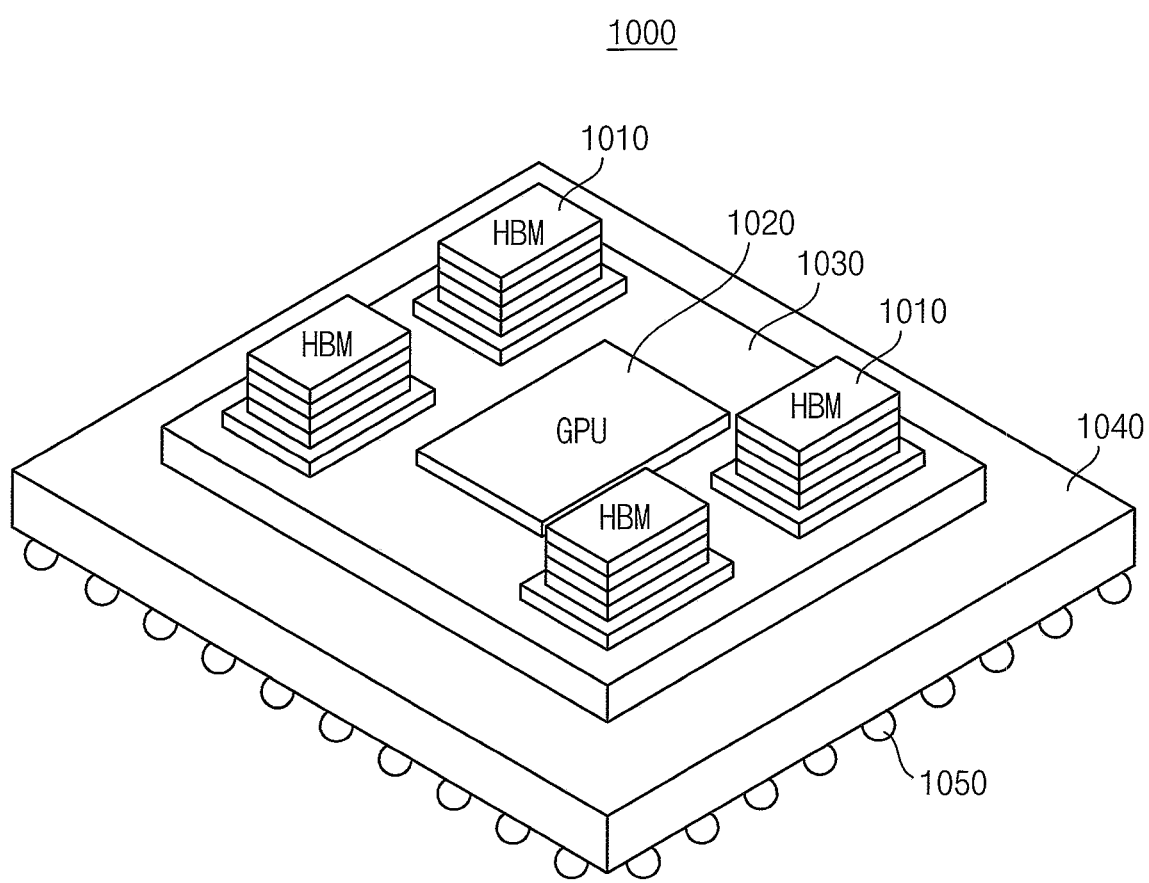
FIG. 31 is a configuration diagram illustrating a semiconductor package including the stacked memory device according to example embodiments.

FIG. 31 is a configuration diagram illustrating a semiconductor package including the stacked memory device according to example embodiments.

Referring to FIG. 31, a semiconductor package 1000 may include one or more stacked memory devices 1010 and a graphic processing unit (GPU) 1020.

The stacked memory devices 1010 and the GPU 1020 may be mounted on an interposer 1030, and the interposer on which the stacked memory device 1010 and the GPU 1020 are mounted may be mounted on a package substrate 1040 mounted on solder balls 1050. The GPU 1020 may correspond to a semiconductor device which may perform a memory control function, and for example, the GPU 1020 may be implemented as an application processor (AP). The GPU 1020 may include a memory controller having a scheduler.

The stacked memory device 1010 may be implemented in various forms, and the stacked memory device 1010 may be a memory device in a high bandwidth memory (HBM) form in which a plurality of layers are stacked. Accordingly, the stacked memory device 1010 may include a buffer die and a plurality of memory dies and each of the plurality of memory dies include a cell core and a timing/voltage control circuit.

The plurality of stacked memory devices 1010 may be mounted on the interposer 1030, and the GPU 1020 may communicate with the plurality of stacked memory devices 1010. For example, each of the stacked memory devices 1010 and the GPU 1020 may include a physical region, and communication may be performed between the stacked memory devices 1010 and the GPU 1020 through the physical regions. Meanwhile, when the stacked memory device 1010 includes a direct access region, a test signal may be provided into the stacked memory device 1010 through conductive means (e.g., solder balls 1050) mounted under package substrate 1040 and the direct access region.

Aspects of the present disclosure may be applied to systems using semiconductor memory devices that employ volatile memory cells. For example, aspects of the present inventive concept may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
   a memory cell array including a plurality of bank arrays, each of the plurality of bank arrays including a plurality of volatile memory cells coupled to word-lines and bit-lines, wherein each of the plurality of bank arrays is divided into a plurality of row blocks by one or more row block identity bits, and each of the of row blocks includes a plurality of sub-array blocks arranged in a first direction, a row address comprising the one or more row block identity bits;
   a row decoder configured to activate a first word-line coupled to a first memory cell from among the plurality of volatile memory cells and configured to activate a second word-line coupled to a second memory cell from among the plurality of volatile memory cells in response to the row address, the row decoder being further configured to output a row block information signal indicating a first row block including the first memory cell and a second row block including the second memory cell;
   a column decoder configured to access the first memory cell and the second memory cell through a first bit-line based on a column address; and
   a timing/voltage control circuit configured to receive the row block information signal and configured to control the column decoder to adjust at least one of an operation interval and an operation voltage of a memory operation on the first memory cell and the second memory cell according to a distance to the first row block and the second row block from the column decoder in a second direction crossing the first direction, based on the row block information signal.

2. The semiconductor memory device of claim 1, further comprising:
a row hammer management circuit configured to:
count a number of times of access associated with each of the plurality of memory cell rows in response to an active command from an external memory controller and store the counted values in count cells of each of the plurality of memory cell rows as count data, and
determine a hammer address associated with at least one of the plurality of memory cell rows, which is accessed more than a predetermined reference number of times, based on the counted values, and output the hammer address; and
a refresh control circuit configured to receive the hammer address and to perform a hammer refresh operation on one or more victim memory cell rows, which are physically adjacent to a memory cell row corresponding to the hammer address.

3. A semiconductor memory device comprising:
a memory cell array including a plurality of bank arrays, each of the plurality of bank arrays including a plurality of volatile memory cells coupled to word-lines and bit-lines, wherein each of the plurality of bank arrays is divided into a plurality of row blocks by one or more row block identity bits, and each of the of row blocks includes a plurality of sub-array blocks arranged in a first direction, a row address comprising the one or more row block identity bits;
a row decoder configured to activate a first word-line coupled to a first memory cell from among the plurality of volatile memory cells and configured to activate a second word-line coupled to a second memory cell from among the plurality of volatile memory cells in response to the row address, the row decoder being further configured to output a row block information signal indicating a first row block including the first memory cell and a second row block including the second memory cell;
a column decoder configured to access the first memory cell and the second memory cell through a first bit-line based on a column address; and
a timing/voltage control circuit configured to receive the row block information signal and configured to control the column decoder to adjust at least one of an operation interval and an operation voltage of a memory operation on the first memory cell and the second memory cell according to a distance to the first row block and the second row block from the column decoder in a second direction crossing the first direction, based on the row block information signal, wherein the timing/voltage control circuit is further configured to control the column decoder, such that a level of the operation voltage or a current driving strength of the operation voltage is increased based on an increase of the distance in the second direction and the operation interval is decreased based on the increase of the distance in the second direction.

4. The semiconductor memory device of claim 3, further comprising:
a first bit-line sense amplifier connected to the first memory cell;
a second bit-line sense amplifier connected to the second memory cell;
a first local sense amplifier circuit connected to the first bit-line sense amplifier through a first local input/output (I/O) line pair;
a second local sense amplifier circuit connected to the second bit-line sense amplifier through a second local I/O line pair; and
an I/O sense amplifier connected to the first local sense amplifier and the second local sense amplifier through a global I/O line pair,
wherein a distance of the first memory cell in the second direction from a reference position is a baseline distance, and
wherein a distance of the second memory cell in the second direction from the reference position is relatively long compared to the baseline distance.

5. The semiconductor memory device of claim 4, wherein the column decoder includes a column selection line driver configured to drive a column selection line coupled to the first bit-line sense amplifier and the second bit-line sense amplifier, and
wherein the timing/voltage control circuit is further configured to control the column selection line driver, such that a voltage level of the column selection line associated with selecting the second memory cell is greater than a voltage level of the column selection line associated with selecting the first memory cell.

6. The semiconductor memory device of claim 5, wherein the column selection line driver includes:
a first power switch that includes a source coupled to a first power supply voltage, a gate configured to receive a first bit of a driving control signal and a drain coupled to a first node;
a second power switch that includes a source coupled to a second power supply voltage greater than the first power supply voltage, a gate configured to receive a second bit of the driving control signal, and a drain coupled to the first node;
a p-channel metal-oxide semiconductor (PMOS) transistor that includes a source coupled to the first node, a gate configured to receive a decoded column address, which is generated based on the column address, and a drain coupled to a second node; and
an n-channel metal-oxide semiconductor (NMOS) transistor that includes a drain coupled to the second node, a gate configured to receive the decoded column address, and a source coupled to a ground voltage, and
wherein the column selection line driver is configured to drive the column selection line with a voltage of the second node.

7. The semiconductor memory device of claim 6, wherein the timing/voltage control circuit is further configured to:
in response to the first memory cell being accessed, drive the column selection line based on a level of the first power supply voltage by turning-on the first power switch and turning-off the second power switch using the driving control signal;
in response to the second memory cell being accessed, drive the column selection line based on a level of the second power supply voltage by turning-off the first power switch and turning-on the second power switch using the driving control signal; and
in response to a third memory cell being accessed, drive the column selection line by turning-on the first power switch and the second power switch using the driving control signal, a distance of the third memory cell in the second direction from the reference position being greater than the distance of the second memory cell in the second direction from the reference position.

8. The semiconductor memory device of claim 4, wherein the column decoder includes a column selection line driver configured to drive a column selection line coupled to the first bit-line sense amplifier and the second bit-line sense amplifier, and
wherein the timing/voltage control circuit is further configured to control the column selection line driver, such that a current driving capability associated with the column selection line associated with selecting the second memory cell is greater than a current driving capability associated with the column selection line associated with selecting the first memory cell.

9. The semiconductor memory device of claim 8, wherein the column selection line driver includes:
a first AND gate configured to perform an AND operation on a first bit of a driving control signal and a decoded column address, which is generated based on the column address;
a second AND gate configured to perform an AND operation on a second bit of the driving control signal and the decoded column address;
a third AND gate configured to perform an AND operation on a third bit of the driving control signal and the decoded column address;
a first p-channel metal-oxide semiconductor (PMOS) transistor that includes a source coupled to a power supply voltage, a gate configured to receive an output of the first AND gate, and a drain coupled to a first node;
a second PMOS transistor that includes a source coupled to the power supply voltage, a gate configured to receive an output of the second AND gate, and a drain coupled to the first node;
a third PMOS transistor that includes a source coupled to the power supply voltage, a gate configured to receive an output of the third AND gate, and a drain coupled to the first node; and
an n-channel metal-oxide semiconductor (NMOS) transistor that includes a drain coupled to the first node, a gate configured to receive the decoded column address, and a source coupled to a ground voltage, and
wherein the column selection line driver is configured to drive the column selection line with a voltage of the first node.

10. The semiconductor memory device of claim 9, wherein the timing/voltage control circuit is further configured to:
in response to the first memory cell being accessed, drive the column selection line based on a current driving capability of the first PMOS transistor by turning-on the first PMOS transistor and turning-off the second PMOS transistor and the third PMOS transistor using the driving control signal;
in response to the second memory cell being accessed, drive the column selection line based on a current driving capability of the first PMOS transistor and the second PMOS transistor by turning-on the first PMOS transistor and the second PMOS transistor and turning off the third PMOS transistor using the driving control signal; and
in response to a third memory cell being accessed, drive the column selection line by turning-on the first PMOS transistor, the second PMOS transistor and the third PMOS transistor using the driving control signal, a distance of the third memory cell in the second direction from the reference position being greater than the distance of the second memory cell in the second direction from the reference position.

11. The semiconductor memory device of claim 4, wherein the column decoder includes a column selection line driver configured to drive a column selection line coupled to the first bit-line sense amplifier and the second bit-line sense amplifier, and
wherein the timing/voltage control circuit includes:
a row block information decoder configured to decode the row block information signal to output a decoded row block signal;
a column selection line decision logic configured to generate a first driving control signal for controlling a column selection line driver based on the decoded row block signal;
a first decision logic configured to generate a second driving control signal to determine an activation interval of a local sense enable signal that activates the first local sense amplifier and the second local sense amplifier based on the decoded row block signal;
a second decision logic configured to generate a third driving control signal to determine an activation interval of an I/O sense enable signal that activates the I/O sense amplifier based on the decoded row block signal; and
a first signal generator configured to the I/O sense enable signal based on the third driving control signal.

12. The semiconductor memory device of claim 11, wherein the column selection line decision logic is configured to:
generate the first driving control signal, such that a voltage level of the column selection line associated with selecting the second memory cell is greater than a voltage level of the column selection line associated with selecting the first memory cell; or
generate the first driving control signal, such that a current driving capability associated with the column selection line associated with selecting the second memory cell is greater than a current driving capability associated with the column selection line associated with selecting the first memory cell.

13. The semiconductor memory device of claim 11, wherein the first decision logic is configured to generate the second driving control signal such that a first activation interval of the local sense enable signal applied to the first local sense amplifier is shorter than a second activation interval of the local sense enable signal applied to the second local sense amplifier.

14. The semiconductor memory device of claim 13, wherein the column decoder further includes a second signal generator configured to generate the local sense enable signal based on the second driving control signal, and
wherein the second signal generator includes:
a deactivation interval adjusting logic configured to generate a deactivation interval signal to adjust a deactivation interval of the local sense enable signal based on the second driving control signal; and
an AND gate configured to perform an AND operation on the deactivation interval signal and a first local sense enable signal having a fixed activation interval to output the local sense enable signal.

15. The semiconductor memory device of claim 11, wherein the second decision logic is configured to generate the third driving control signal, such that a first activation interval of the I/O sense enable signal associated with accessing the first memory cell is shorter than a second activation interval of the I/O sense enable signal associated with accessing the second memory cell.

16. The semiconductor memory device of claim 14, wherein the first signal generator includes:
    a deactivation interval adjusting logic configured to generate a deactivation interval signal to adjust a deactivation interval of the I/O sense enable signal based on the third driving control signal; and
    an AND gate configured to perform an AND operation on the deactivation interval signal and a first I/O sense enable signal having a fixed activation interval to output the I/O sense enable signal.

17. The semiconductor memory device of claim 11, wherein the column selection line decision logic is configured to:
    generate the first driving control signal, such that a voltage level of the column selection line associated with selecting the second memory cell is greater than a voltage level of the column selection line associated with selecting the first memory cell; or
    generate the first driving control signal such that a current driving capability associated with the column selection line associated with selecting the second memory cell is greater than a current driving capability associated with the column selection line associated with selecting the first memory cell, and
    wherein the second decision logic is configured to generate the third driving control signal such that a first activation interval of the I/O sense enable signal associated with accessing the first memory cell is shorter than a second activation interval of the I/O sense enable signal associated with accessing the second memory cell.

18. A semiconductor memory device comprising:
    a memory cell array including a plurality of bank arrays, each of the plurality of bank arrays including a plurality of volatile memory cells coupled to word-lines and bit-lines, wherein each of the plurality of bank arrays blocks are divided into a plurality of row blocks by one or more row block identity bits and each of the of row blocks includes a plurality of sub-array blocks arranged in a first direction, a row address comprising the one or more row block identity bits;
    a row decoder configured to activate a first word-line coupled to a first memory cell from among the plurality of volatile memory cells and configured to activate a second word-line coupled to a second memory cell from among the plurality of volatile memory cells in response to the row address, the row decoder being further configured to output a row block information signal indicating a first row block including the first memory cell and a second row block including the second memory cell;
    a column decoder configured to access the first memory cell and the second memory cell through a first bit-line based on a column address; and
    a timing/voltage control circuit configured to receive the row block information signal and configured to provide operation control signals to the column decoder according to a distance to the first row block and the second row block from the column decoder in a second direction crossing the first direction, based on the row block information signal,
    wherein a distance of the first memory cell in the second direction from a reference position is relatively short,
    wherein a distance of the second memory cell in the second direction from the reference position is relatively long, and
    wherein the timing/voltage control circuit is configured to:
    control the column decoder to control a column selection line driver to drive a column selection line, such that a voltage level of the column selection line associated with selecting the second memory cell is greater than a voltage level of the column selection line associated with selecting the first memory cell;
    control a local sense enable signal, such that a first activation interval of the local sense enable signal associated with accessing the first memory cell is shorter than a second activation interval of the local sense enable signal associated with accessing the second memory cell; and
    control an input/output (I/O) sense enable signal such that a first activation interval of the I/O sense enable signal associated with accessing the first memory cell is shorter than a second activation interval of the I/O sense enable signal associated with accessing the second memory cell.

* * * * *